(12) United States Patent
Yonemaru et al.

(10) Patent No.: US 8,731,135 B2
(45) Date of Patent: May 20, 2014

(54) SHIFT REGISTER AND DISPLAY DEVICE

(75) Inventors: Masashi Yonemaru, Osaka (JP);
Masahiko Nakamizo, Osaka (JP);
Yasuaki Iwase, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/575,448

(22) PCT Filed: Nov. 11, 2010

(86) PCT No.: PCT/JP2010/070135
§ 371 (c)(1),
(2), (4) Date: Oct. 19, 2012

(87) PCT Pub. No.: WO2011/092924
PCT Pub. Date: Aug. 4, 2011

(65) Prior Publication Data
US 2013/0044854 A1    Feb. 21, 2013

(30) Foreign Application Priority Data
Jan. 29, 2010    (JP) .................................. 2010-019369

(51) Int. Cl.
*G11C 19/00*    (2006.01)

(52) U.S. Cl.
USPC .................................. 377/64; 377/78; 377/79

(58) Field of Classification Search
None
See application file for complete search history.

(56) References Cited

U.S. PATENT DOCUMENTS

| | | | |
|---|---|---|---|
| 5,646,642 A | 7/1997 | Maekawa et al. | |
| 5,748,026 A | 5/1998 | Maekawa et al. | |
| 6,295,046 B1 | 9/2001 | Hebiguchi | |
| 6,426,743 B1 | 7/2002 | Yeo et al. | |
| 6,556,646 B1 | 4/2003 | Yeo et al. | |
| 2003/0002615 A1 | 1/2003 | Morosawa et al. | |
| 2005/0008114 A1 | 1/2005 | Moon | |
| 2007/0248205 A1 | 10/2007 | Deane | |
| 2011/0001732 A1* | 1/2011 | Morii et al. | 345/204 |
| 2012/0044133 A1* | 2/2012 | Nakamizo et al. | 345/100 |
| 2012/0076256 A1* | 3/2012 | Yonemaru et al. | 377/79 |
| 2012/0087459 A1* | 4/2012 | Nakamizo et al. | 377/64 |
| 2012/0194489 A1* | 8/2012 | Iwamoto et al. | 345/204 |
| 2012/0307959 A1* | 12/2012 | Furuta et al. | 377/64 |
| 2012/0326955 A1* | 12/2012 | Ohara | 345/92 |
| 2013/0028370 A1* | 1/2013 | Kikuchi et al. | 377/64 |
| 2013/0170606 A1* | 7/2013 | Matsui | 377/64 |

FOREIGN PATENT DOCUMENTS

| | | |
|---|---|---|
| JP | 02-246098 A1 | 10/1990 |
| JP | 06-216753 A1 | 8/1994 |
| JP | 11-086586 A1 | 3/1999 |
| JP | 2000-155550 A1 | 6/2000 |
| JP | 2003/016794 A1 | 1/2003 |
| JP | 2003-346492 A1 | 12/2003 |
| JP | 2005-050502 A1 | 2/2005 |
| JP | 2008508654 A1 | 3/2008 |
| WO | 2010/097986 A1 | 9/2010 |

OTHER PUBLICATIONS

ISR and WO for PCT/JP2010/070135 dated Feb. 15, 2011.

* cited by examiner

*Primary Examiner* — Tuan T Lam

(74) *Attorney, Agent, or Firm* — Lowe Hauptman & Ham LLP

(57) ABSTRACT

Each stage of a shift register includes: a shift pulse input terminal; a shift pulse output terminal; first to fifth terminals; an input gate, first to fourth switching elements; a first output transistor, and a first circuit, connected between a first output terminal and the second input terminal, which forms a current path between the first output terminal and the second input terminal.

33 Claims, 18 Drawing Sheets

F I G. 1 1
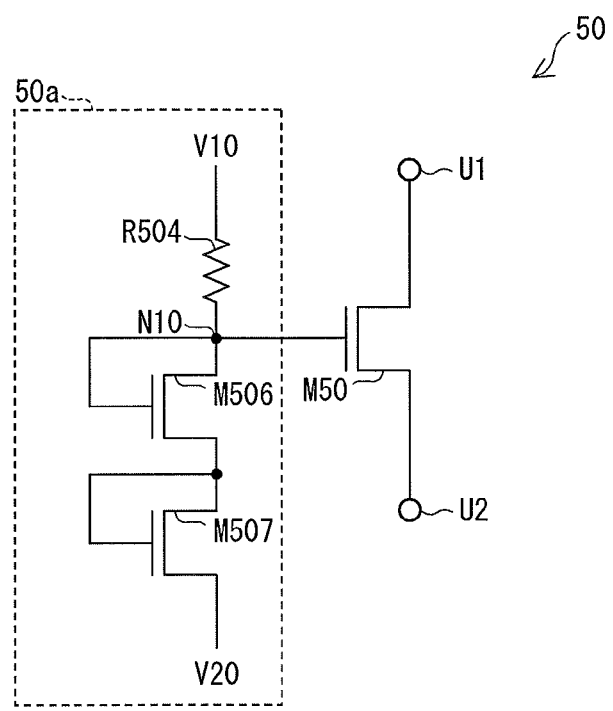

F I G. 1 6
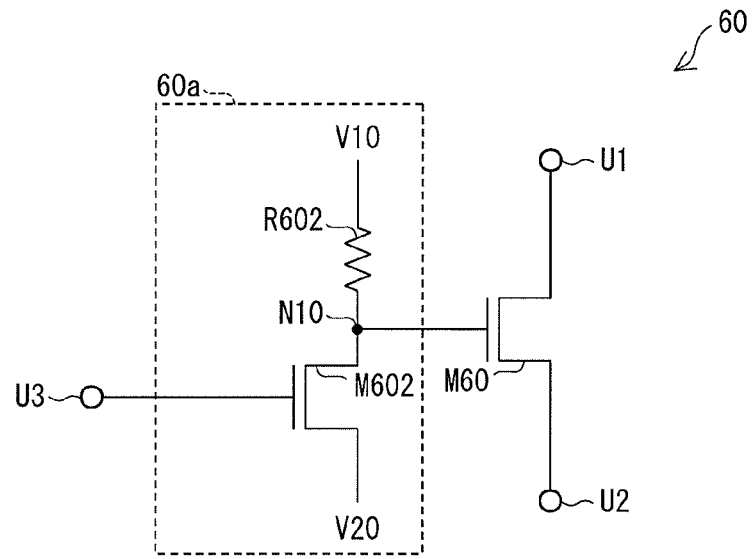
F I G. 1 7
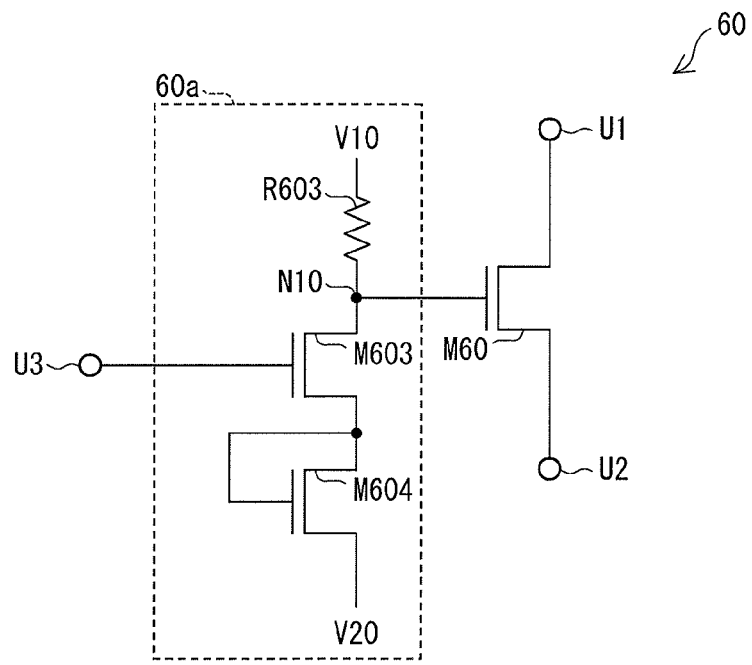

F I G. 1 9
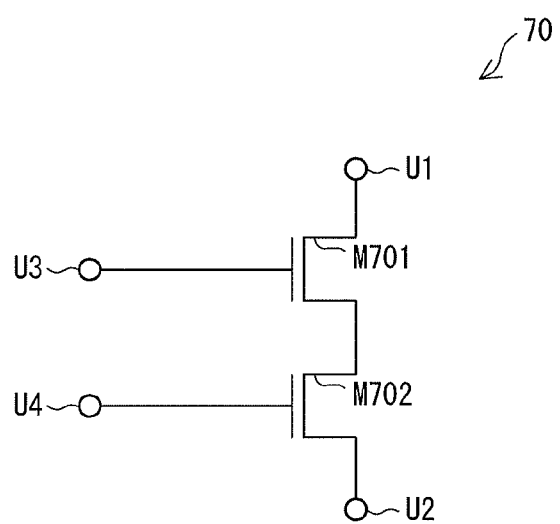

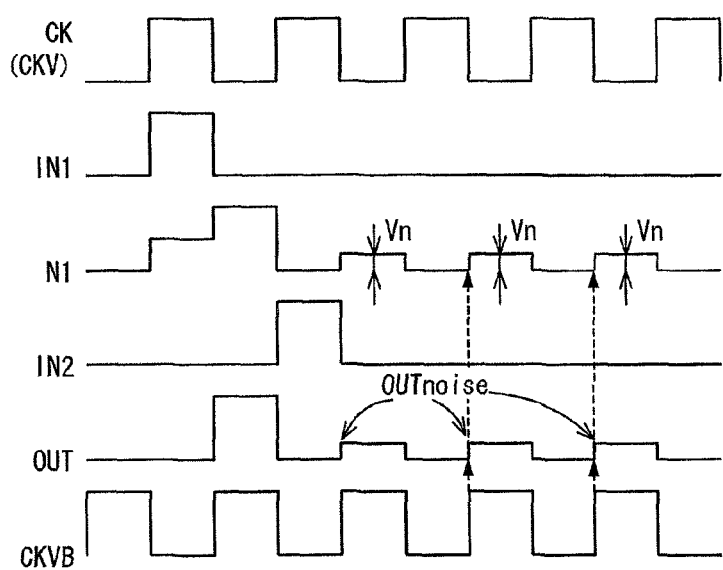
F I G. 2 4 (PRIOR ART)

F I G. 2 5 (PRIOR ART)
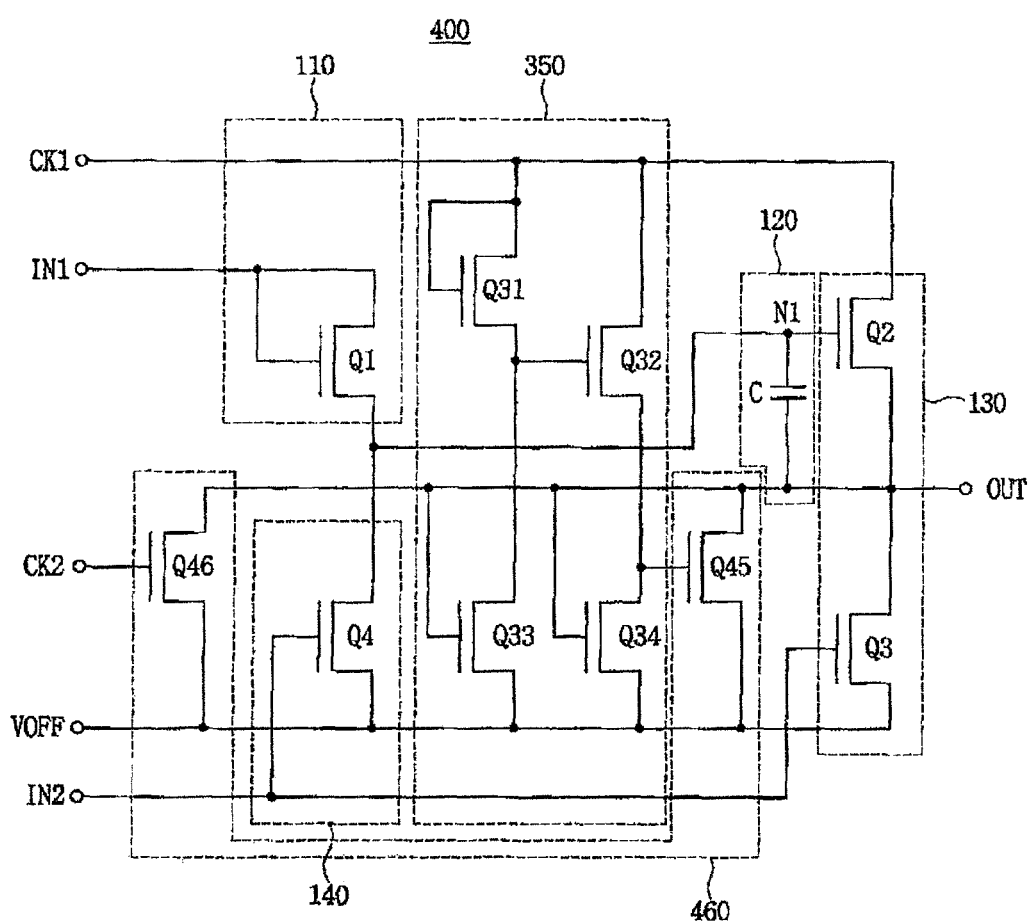

SHIFT REGISTER AND DISPLAY DEVICE

RELATED APPLICATIONS

The present application is national phase of International Application No. PCT/JP2010/070135 filed Nov. 11, 2010, and claims priority from, Japanese Application Number 2010-019369, filed Jan. 29, 2010.

TECHNICAL FIELD

The present invention relates to a shift register that is used in a gate driver, etc. of a display panel.

BACKGROUND ART

In recent years, gate monolithcization has been under way to reduce costs by forming a gate driver on a liquid crystal panel with amorphous silicon. Such a gate monolithic is also referred to as gate driverless, panel-built-in gate driver, gate-in-panel, etc.

FIG. 21 shows a configuration of such a gate driver (scan drive circuit) as that described in Patent Literature 1.

The gate driver is configured to have a cascade arrangement of unit stages SRC11, SRC12, ..., SRC1N, and SRC1D. Each of the unit stages receives a first clock CKV, in the case of an odd-numbered unit stage, or a second clock CKVB, in the case of an even-numbered unit stage, via its clock terminal CK. The first clock CKV and the second clock CKVB are opposite in phase to each other. The unit stages SRC11, SRC12, ..., SRC1N, and SRC1D output gate terminal signals (G1, G2, ..., GN, and GD) to a gate bus line via their respective output terminals OUT.

The first unit stage SRC11 receives a scan start signal STV via its first input terminal IN1, and the subsequent stages SRC12, SRC13, ..., SRC1N, and SRC1D receive gate terminal signals from the previous unit stages via their respective first input terminals IN1. Further, the stages SRC11, SRC12, ..., SRC1N, and SRC1D receive gate terminal signals from the next unit stages via their respective second input terminals IN2. Furthermore, each of the unit stages includes a first voltage terminal VOFF.

CITATION LIST

Patent Literature 1

Japanese Patent Application Publication, Tokukai, No. 2005-50502 (Publication Date: Feb. 24, 2005)

Patent Literature 2

Japanese Patent Application Publication, Tokukai, No. 2000-155550 (Publication Date: Jun. 6, 2000)

Patent Literature 3

Japanese Patent Application Publication, Tokukai, No. 2003-016794 (Publication Date: Jan. 17, 2003)

Patent Literature 4

Japanese Patent Application Publication, Tokukaihei, No. 6-216753 (Publication Date: Aug. 5, 1994)

Patent Literature 5

Japanese Patent Application Publication, Tokukai, No. 2003-346492 (Publication Date: Dec. 5, 2003)

Patent Literature 6

Japanese Translation of PCT International Publication, Tokuhyo, No. 2008-508654 (Publication Date: Mar. 21, 2008)

SUMMARY OF INVENTION

Technical Problem

In Patent Literature 1, such a circuit configuration of a unit stage 100 as that shown in FIG. 22 is disclosed as each of the unit stages SRC11, SRC12, ..., SRC1N, and SRC1D. The unit stage 100 includes a buffer section 110, a charging section 120, a driving section 130, a discharging section 140, and a holding section 150.

Here, think of a case of operation of this circuit where the unit stage 100 receives a first clock CKV or a second clock CKVB of FIG. 23 as set by the applicant of the present application. That is, in a case where the unit stage 100 is an odd-numbered unit stage, the unit stage 100 is supposed to receive the first clock CKV of FIG. 23 via its clock terminal CK, and in a case where the unit stage 100 is an even-numbered unit stage, the unit stage 100 is supposed to receive the second clock CKV of FIG. 23 via its clock terminal CK. The first clock CKV and the second clock CKVB are opposite in phase to each other.

And now, take as an example a case where the unit stage 100 is an even-numbered unit stage.

As shown in FIG. 23, upon receipt of a gate terminal pulse from the previous unit stage 100 via the first input terminal IN1, i.e., via the gate terminal and drain of a transistor Q1 of the buffer section 110, the transistor Q1 comes into an ON state, so that the charging section 120 has its capacitor C charged. This causes a transistor Q2 of the driving section 130 to come into an ON state. When, after the gate terminal pulse received from the previous stage via the first input terminal IN1 has been dropped to a Low level and the transistor Q1 has come into an OFF state, the second clock CKVB is outputted at a High level to the transistor Q2 via its drain, the potential of a node N1 is boosted by a bootstrap effect of the capacitor C, and the channel resistance of the transistor Q2 becomes sufficiently small, so that a gate terminal pulse substantially equal in amplitude to a clock signal is outputted via the output terminal OUT.

Further, when this gate terminal pulse is inputted to the next unit stage 100 and a gate terminal pulse is outputted from the next unit stage 100, the gate terminal pulse is inputted to the current unit stage 100 via its second input terminal IN2. This causes a transistor Q3 of the driving section 130 and a transistor Q4 of the discharging section 140 to come into an ON state, and the output terminal OUT, the gate bus line, and the node N1 are each connected to the first voltage terminal VOFF and reset to a Low level.

During a period in which the other unit stages 100 are operating, a transistor Q5 of the holding section 150 comes into an ON state every time the second clock CKVB inputted via the clock terminal CK is raised to a High level, so that the node N1 is periodically connected to the output terminal OUT.

Further, an odd-numbered unit stage 100 operates in a similar manner at timings one clock pulse off the timings of FIG. 23.

Even with use of only n-channel TFTs, the foregoing gate monolithic circuit configuration can improve driving capabilities by sufficiently reducing the channel resistance of an output transistor such as the transistor Q2 by the bootstrap effect. Therefore, the foregoing gate monolithic circuit configuration gives such an advantage that even in the case of monolithic formation of a gate driver within a panel with material, such as amorphous silicon, which makes it difficult to fabricate TFTs other than n-channel TFTs, a demand for a lower voltage for panels can be met by sufficiently overcoming the disadvantageous characteristics, such as high threshold voltage and low electron mobility, of amorphous silicon TFTs.

However, since the output transistor represented by the transistor Q2 of FIG. 22 has a parasitic capacitor between the gate terminal and the drain (hereinafter referred to as "drain parasitic capacitor") and a parasitic capacitor between the gate terminal and the source terminal (hereinafter referred to as "source parasitic capacitor"), the conventional gate monolithic circuit has such a problem that there occurs a distortion in the waveform of output via the gate terminal.

To the drain of the transistor Q2, the voltage of the clock inputted via the clock terminal CK is always applied. Therefore, every time the clock rises, there occurs a fluctuation DN in the potential of the node 1 through the drain parasitic capacitor due to a so-called feed-through phenomenon as shown in FIG. 23, and this fluctuation causes a leak in the transistor Q2 even in a period during which the transistor Q2 should be turned OFF. A leak in the transistor Q2 causes a signal LO, which leaked in a period during which the gate terminal output should be in an OFF state, to be outputted via the output terminal OUT as shown in FIG. 23.

Further, if the potential of the node N1 is to exceed the threshold potential of the transistor Q2 when there has occurred a fluctuation DN in the potential of the node N1 through the drain parasitic capacitor due to the feed-through phenomenon, the transistor Q2 comes into an ON state. Therefore, as shown in FIG. 24, the transistor Q2 leaks out the clock via its source terminal and the source terminal output boosts the potential of the node N1 through the capacitor C. This undesirably causes the potential of the node N1 to be higher by Vn between one clock pulse and another and causes a pulse OUTnoise, which rises with a pulse width equal to the duration of a clock pulse, to be outputted via the output terminal OUT.

For a period during which the gate terminal pulse should be outputted via the output terminal OUT, the fluctuation DN in the potential of the node N1 through the drain parasitic capacitor acts in such a direction as to decrease the channel resistance of the transistor Q2 and increase an electric current, and therefore has an effect of enhancing the driving capabilities of the transistor Q2. However, since, in a normal situation, each frame has only one timing at which the gate terminal pulse is outputted via the output terminal OUT, a fluctuation DN in the potential of the node N1 in a period other than a period of gate terminal pulse output ends up being noise. For example, in the case of a panel with resolution of WXGA, which includes 768 gate bus lines, boosts in the potential of the node N1 for periods of 767 clocks and for blanking periods provided at boundaries between one frame and another as defined by a vertical synchronizing signal Vsync, in a period other than a period during which each stage outputs an original gate terminal pulse to its corresponding gate bus line, end up being noise.

Further, since the source terminal parasitic capacitor has an effect of boosting the potential of the node N1 at the time of gate terminal pulse output, and therefore works in favor of enhancing the driving capabilities of the transistor Q2. This effect can be achieved to some extent through the source terminal parasitic capacitor alone. However, a bootstrap capacitor represented by the capacitor C in the transistor Q2 in FIG. 22 is the one whose function has been positively enhanced by combining a capacitor with the source terminal parasitic capacitor in parallel. However, in a case where this method is employed, no boot effect is exerted until the potential of the output terminal OUT rises completely; therefore, there is such a defect that a rise TR in the gate terminal pulse becomes slow. Such a delay in the rise TR ends up being a distortion in the waveform of the gate terminal pulse.

Thus, the stage configuration of FIG. 22 has such a problem as to invite noise in stage output. Further, since each stage sends its output to the next stage, the noise propagates through the subsequent stages in a chain reaction and, as a result, may cause a malfunction in the shift register.

In view of this, Patent Literature 1 proposes another stage configuration, shown in FIG. 25, in which the accumulation and propagation of noise in stage output are prevented by adding a circuit.

In FIG. 25, transistors Q45 and Q46 are provided so that a Low level is kept by connecting the output terminal OUT and the gate bus line to the first voltage terminal VOFF every time the clock rises in a period other than a period of gate terminal pulse output. In this case, a control circuit composed of transistors Q31 to Q34 is provided so that the transistor Q45 functions. Further, for a longer period of connection to the first voltage terminal VOFF, a unit stage 400 is provided with two clock terminals, namely first and second clock terminals CK1 and CK2, via which clocks opposite in phase to each other are inputted, respectively, so that the transistor Q45 and the transistor Q46 come into an ON state alternately.

However, such a configuration as that shown in FIG. 25 is not preferable, because it requires such an additional circuit as that mentioned above and therefore brings about an increase in the number of elements in a circuit and an increase in the area of a circuit.

The present invention has been made in view of the foregoing conventional problems, and it is an object of the present invention to achieve a shift register capable of satisfactorily reducing noise in output from each stage without increasing circuit size and a display device including such a shift register.

Solution to Problem

In order to solve the foregoing problems, a shift register of the present invention is a shift register including a cascade arrangement of stages for transmitting a shift pulse, each of the stages including: a shift pulse input terminal via which the shift pulse is inputted; an output terminal via which a signal is outputted from the stage, the stage including, as one output terminal, a shift pulse output terminal via which the shift pulse is outputted; a first input terminal to which a first direct-current voltage is applied; a second input terminal to which a second direct-current voltage is applied, the second direct-current voltage being different from the first direct-current voltage; a third input terminal via which a first clock signal is inputted to each of the stages, the first clock signal having its clock pulse active in a period that is out of overlap with a period of the shift pulse that is inputted via the shift pulse input terminal, a fourth input terminal via which a signal indicating connection and disconnection between a first predetermined point and the second input terminal is inputted; a fifth input terminal via which a signal indicating connection and disconnection between a second predetermined point and the second input terminal is inputted; a first output transistor having one drain/source terminal connected to the first input terminal, with the other drain/source terminal serving as a first output terminal constituting one output terminal that serves also as the shift pulse output terminal or one output terminal that is different from the shift pulse output terminal, the one output terminal being included in those output terminals via which signals are outputted from the stage; a first capacitor having one end connected to a gate terminal of the first output transistor; an input gate, connected to the shift pulse input terminal, which becomes conductive in accordance with a conduction control signal to allow passage of a potential during the period of the shift pulse so that the potential is supplied to the one end of the first capacitor, the conduction control signal being the shift pulse that is inputted via the shift pulse input terminal; a first switching element having one end connected to the other end of the first capacitor, the other end connected to the first input terminal, and a conduction and disconnection control terminal connected to the third input terminal; a second switching element having one end connected to the other end of the first capacitor, the other end connected to the second input terminal, and a conduction and disconnection control terminal connected to the shift pulse input terminal; a third switching element having one end connected to the one end of the first capacitor, the other end connected to the second input terminal, and a conduction and disconnection control terminal connected to the fourth input terminal, the one end of the first capacitor serving as the first predetermined point; a fourth switching element having one end connected to the first output terminal, the other end connected to the second input terminal, and a conduction and disconnection control terminal connected to the fifth input terminal, the first output terminal serving as the second predetermined point; and a first circuit, connected between the first output terminal and the second input terminal, which forms a current path between the first output terminal and the second input terminal.

According to the foregoing embodiment, the occurrence of a feed-through phenomenon through the drain parasitic capacitance and source terminal parasitic capacitance of the first output transistor can be avoided by applying the first direct-current voltage to the drain of the first output transistor and carrying out a switched capacitor operation using the first switching element, the second switching element, and the first capacitor. This makes it possible to prevent a fluctuation in output voltage that occurs in a case where the first output transistor receives a clock signal via its drain and a leakage of electric charges from liquid crystal picture element electrodes that occurs due to the fluctuation in output voltage, thus eliminating the need for an additional circuit for frequently connecting the first output terminal of the stage to a Low power supply.

This brings about an effect of making it possible to achieve a shift register capable of satisfactorily reducing noise in output from each stage without increasing circuit size.

Further, the provision of the first circuit causes a current path to be formed between the first output terminal and the second input terminal. This current path is formed so that while a reduction in voltage during output via the first output terminal is suppressed, the voltage is prevented from becoming higher than a potential that is supplied via the second input terminal when there is no output. This brings about an effect of making it possible to appropriately suppress a rise in potential of the first output terminal in a period during which there is no output to the first output terminal.

Further, the application of the direct-current voltage to the drain of the first output transistor makes it possible to drive the gate bus line by a direct-current power supply, thus bringing about an effect of making it possible to significantly reduce the load on an external level shifter that generates a control signal for the shift register, as compared to a case where the gate bus line is driven with a clock signal by inputting the clock signal to the first output transistor via its drain.

Further, the application of the direct-current voltage to the drain of the first output transistor lengthens the duration of application of negative bias between the gate terminal and drain of the first output transistor, thus making it possible to reduce a rise in threshold voltage. This brings about an effect of making it possible to suppress deterioration in performance of the shift register.

In order to solve the foregoing problems, a shift register of the present invention is a shift register including a cascade arrangement of stages for transmitting a shift pulse, each of the stages including: a shift pulse input terminal via which the shift pulse is inputted; an output terminal via which a signal is outputted from the stage, the stage including, as one output terminal, a shift pulse output terminal via which the shift pulse is outputted; a first input terminal to which a first direct-current voltage is applied; a second input terminal to which a second direct-current voltage is applied, the second direct-current voltage being different from the first direct-current voltage; a third input terminal via which a first clock signal is inputted to each of the stages, the first clock signal having its clock pulse active in a period that is out of overlap with a period of the shift pulse that is inputted via the shift pulse input terminal, a fourth input terminal via which a signal indicating connection and disconnection between a first predetermined point and the second input terminal is inputted; a fifth input terminal via which a signal indicating connection and disconnection between a second predetermined point and the second input terminal is inputted; a first output transistor having one drain/source terminal connected to the first input terminal, with the other drain/source terminal serving as a first output terminal constituting one output terminal that serves also as the shift pulse output terminal or one output terminal that is different from the shift pulse output terminal, the one output terminal being included in those output terminals via which signals are outputted from the stage; a first capacitor having one end connected to a gate terminal of the first output transistor; an input gate, connected to the shift pulse input terminal, which becomes conductive in accordance with a conduction control signal to allow passage of a potential during the period of the shift pulse so that the potential is supplied to the one end of the first capacitor, the conduction control signal being the shift pulse that is inputted via the shift pulse input terminal; a first switching element having one end connected to the other end of the first capacitor, the other end connected to the first input terminal, and a conduction and disconnection control terminal connected to the third input terminal; a second switching element having one end connected to the other end of the first capacitor, the other end connected to the second input terminal, and a conduction and disconnection control terminal connected to the shift pulse input terminal; a third switching element having one end connected to the one end of the first capacitor, the other end connected to the second input terminal, and a conduction and disconnection control terminal connected to the fourth input terminal, the one end of the first capacitor serving as the first predetermined point; a fourth switching element having one end connected to the first output terminal, the other end connected to the second input terminal, and a conduction and disconnection control terminal connected to the fifth input terminal, the first output terminal serving as the second predetermined point; and a first circuit, connected between the first output terminal and the second input terminal, which has a control terminal and which forms a current path between the first output terminal and the second input terminal.

According to the foregoing embodiment, the occurrence of a feed-through phenomenon through the drain parasitic capacitance and source terminal parasitic capacitance of the first output transistor can be avoided by applying the first direct-current voltage to the drain of the first output transistor and carrying out a switched capacitor operation using the first switching element, the second switching element, and the first capacitor. This makes it possible to prevent a fluctuation in output voltage that occurs in a case where the first output transistor receives a clock signal via its drain and a leakage of electric charges from picture element electrodes that occurs due to the fluctuation in output voltage, thus eliminating the need for an additional circuit for frequently connecting the first output terminal of the stage to a Low power supply.

This brings about an effect of making it possible to achieve a shift register capable of satisfactorily reducing noise in output from each stage without increasing circuit size.

Further, the provision of the first circuit causes a current path to be formed between the first output terminal and the second input terminal. This current path is formed so that while a reduction in voltage during output via the first output terminal is suppressed, the voltage is prevented from becoming higher than a potential that is supplied via the second input terminal when there is no output. This brings about an effect of making it possible to appropriately suppress a rise in potential of the first output terminal in a period during which there is no output to the first output terminal.

Further, the application of the direct-current voltage to the drain of the first output transistor makes it possible to drive the gate bus line by a direct-current power supply, thus bringing about an effect of making it possible to significantly reduce the load on an external level shifter that generates a control signal for the shift register, as compared to a case where the gate bus line is driven with a clock signal by inputting the clock signal to the first output transistor via its drain.

Further, the application of the direct-current voltage to the drain of the first output transistor lengthens the duration of application of negative bias between the gate terminal and drain of the first output transistor, thus making it possible to reduce a rise in threshold voltage. This brings about an effect of making it possible to suppress deterioration in performance of the shift register.

Advantageous Effects of Invention

As described above, a shift register of the present invention is a shift register including a cascade arrangement of stages for transmitting a shift pulse, each of the stages including: a shift pulse input terminal via which the shift pulse is inputted; an output terminal via which a signal is outputted from the stage, the stage including, as one output terminal, a shift pulse output terminal via which the shift pulse is outputted; a first input terminal to which a first direct-current voltage is applied; a second input terminal to which a second direct-current voltage is applied, the second direct-current voltage being different from the first direct-current voltage; a third input terminal via which a first clock signal is inputted to each of the stages, the first clock signal having its clock pulse active in a period that is out of overlap with a period of the shift pulse that is inputted via the shift pulse input terminal, a fourth input terminal via which a signal indicating connection and disconnection between a first predetermined point and the second input terminal is inputted; a fifth input terminal via which a signal indicating connection and disconnection between a second predetermined point and the second input terminal is inputted; a first output transistor having one drain/source terminal connected to the first input terminal, with the other drain/source terminal serving as a first output terminal constituting one output terminal that serves also as the shift pulse output terminal or one output terminal that is different from the shift pulse output terminal, the one output terminal being included in those output terminals via which signals are outputted from the stage; a first capacitor having one end connected to a gate terminal of the first output transistor; an input gate, connected to the shift pulse input terminal, which becomes conductive in accordance with a conduction control signal to allow passage of a potential during the period of the shift pulse so that the potential is supplied to the one end of the first capacitor, the conduction control signal being the shift pulse that is inputted via the shift pulse input terminal; a first switching element having one end connected to the other end of the first capacitor, the other end connected to the first input terminal, and a conduction and disconnection control terminal connected to the third input terminal; a second switching element having one end connected to the other end of the first capacitor, the other end connected to the second input terminal, and a conduction and disconnection control terminal connected to the shift pulse input terminal; a third switching element having one end connected to the one end of the first capacitor, the other end connected to the second input terminal, and a conduction and disconnection control terminal connected to the fourth input terminal, the one end of the first capacitor serving as the first predetermined point; a fourth switching element having one end connected to the first output terminal, the other end connected to the second input terminal, and a conduction and disconnection control terminal connected to the fifth input terminal, the first output terminal serving as the second predetermined point; and a first circuit, connected between the first output terminal and the second input terminal, which forms a current path between the first output terminal and the second input terminal.

As described above, a shift register of the present invention is a shift register including a cascade arrangement of stages for transmitting a shift pulse, each of the stages including: a shift pulse input terminal via which the shift pulse is inputted; an output terminal via which a signal is outputted from the stage, the stage including, as one output terminal, a shift pulse output terminal via which the shift pulse is outputted; a first input terminal to which a first direct-current voltage is applied; a second input terminal to which a second direct-current voltage is applied, the second direct-current voltage being different from the first direct-current voltage; a third input terminal via which a first clock signal is inputted to each of the stages, the first clock signal having its clock pulse active in a period that is out of overlap with a period of the shift pulse that is inputted via the shift pulse input terminal, a fourth input terminal via which a signal indicating connection and disconnection between a first predetermined point and the second input terminal is inputted; a fifth input terminal via which a signal indicating connection and disconnection between a second predetermined point and the second input terminal is inputted; a first output transistor having one drain/source terminal connected to the first input terminal, with the other drain/source terminal serving as a first output terminal constituting one output terminal that serves also as the shift pulse output terminal or one output terminal that is different from the shift pulse output terminal, the one output terminal being included in those output terminals via which signals are outputted from the stage; a first capacitor having one end connected to a gate terminal of the first output transistor; an input gate, connected to the shift pulse input terminal, which becomes conductive in accordance with a conduction control signal to allow passage of a potential during the period of the shift pulse so that the potential is supplied to the one end of the first capacitor, the conduction control signal being the shift pulse that is inputted via the shift pulse input terminal; a first switching element having one end connected to the other end of the first capacitor, the other end connected to the first input terminal, and a conduction and disconnection control terminal connected to the third input terminal; a second switching element having one end connected to the other end of the first capacitor, the other end connected to the second input terminal, and a conduction and disconnection control terminal connected to the shift pulse input terminal; a third switching element having one end connected to the one end of the first capacitor, the other end connected to the second input terminal, and a conduction and disconnection control terminal connected to the fourth input terminal, the one end of the first capacitor serving as the first predetermined point; a fourth switching element having one end connected to the first output terminal, the other end connected to the second input terminal, and a conduction and disconnection control terminal connected to the fifth input terminal, the first output terminal serving as the second predetermined point; and a first circuit, connected between the first output terminal and the second input terminal, which has a control terminal and which forms a current path between the first output terminal and the second input terminal.

This brings about an effect of making it possible to achieve a shift register capable of satisfactorily reducing noise in output from each stage without increasing circuit size and a display device including such a shift register. Further, even without making the size of the first output transistor large, an effect of making it possible to appropriately suppress a rise in potential of the first output terminal during a period in which there is no output to the first output terminal is brought about.

BRIEF DESCRIPTION OF DRAWINGS

FIG. 11, showing an embodiment of the present invention, is a circuit diagram showing a configuration of a first circuit of a fifth example of the first embodiment.

FIG. 16, showing an embodiment of the present invention, is a circuit diagram showing a configuration of a first circuit of a third example of the second embodiment.

FIG. 17, showing an embodiment of the present invention, is a circuit diagram showing a configuration of a first circuit of a fourth example of the second embodiment.

FIG. 19, showing an embodiment of the present invention, is a circuit diagram showing a configuration of the first circuit according to the third embodiment.

FIG. 24 is a second waveform chart for explaining problems with a conventional shift register.

FIG. 25, showing a conventional technology, is a circuit diagram showing a second example configuration of a stage provided in a shift register.

DESCRIPTION OF EMBODIMENTS

Embodiments of the present invention are described below with reference to FIGS. 1 through 20.

Figure 20:
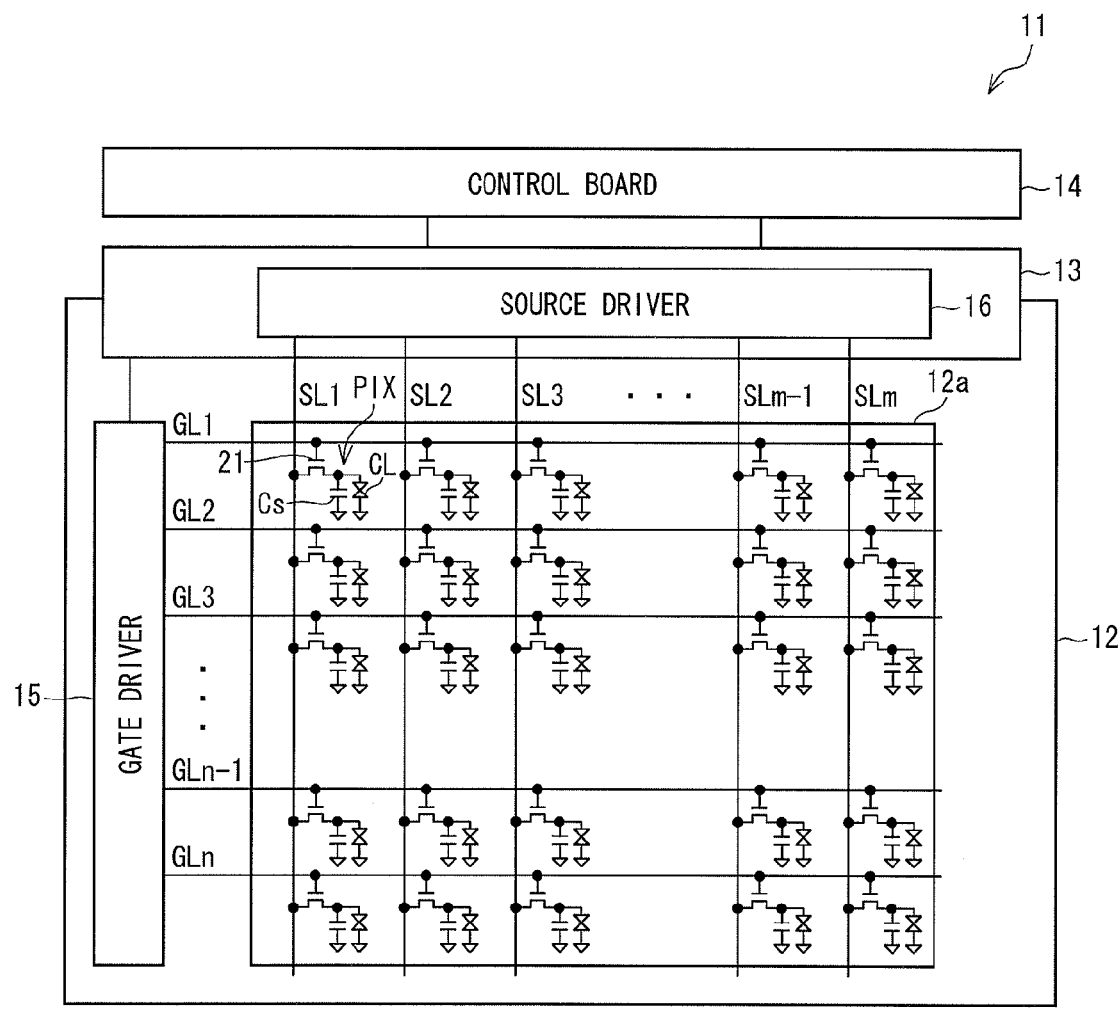
FIG. 20, showing an embodiment of the present invention, is a block diagram showing a configuration of a display device.
Figure 21:
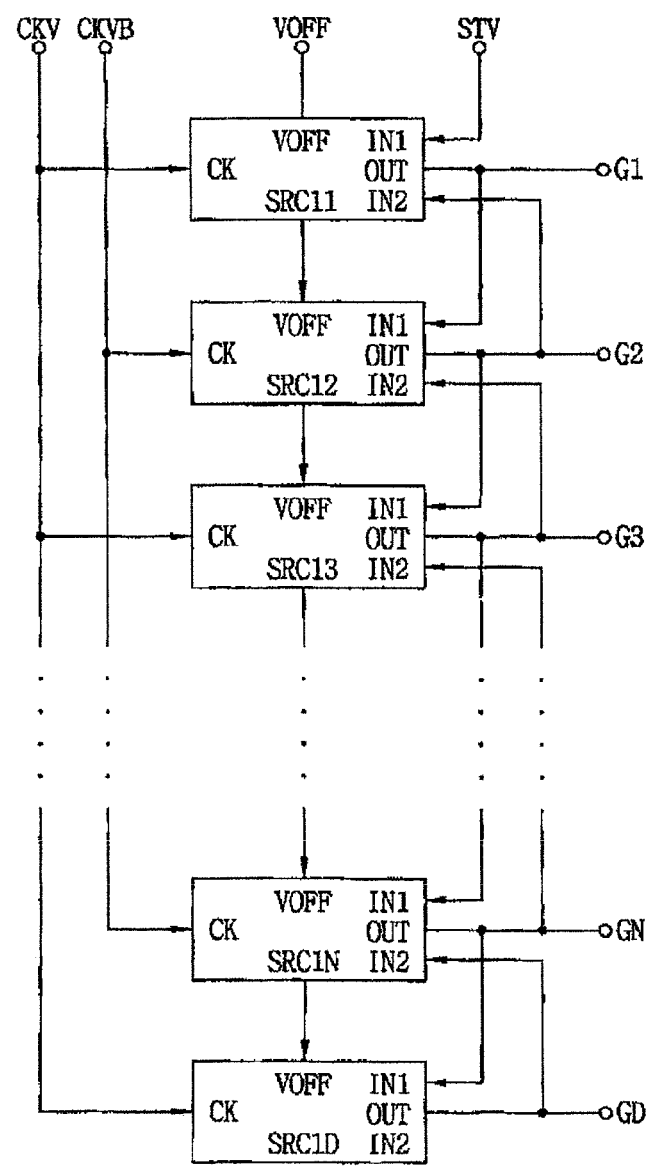
FIG. 21, showing a conventional technology, is a block diagram showing a configuration of a shift register.

FIG. 20 shows a configuration of a liquid crystal display device 11, which is a display device according to the present embodiment.

The liquid crystal display device 11 includes a display panel 12, a flexible printed board 13, and a control board 14.

The display panel 12 is an active-matrix display panel obtained by forming a display region 12a, a plurality of gate bus lines (scanning signal lines) GL . . . , a plurality of source terminal bus lines (data signal lines) SL . . . , and a gate driver (scanning signal line drive circuit) 15 in place on a glass substrate with amorphous silicon. The display panel 12 can also be fabricated by using TFTs made with polycrystalline silicon, CG silicon, microcrystalline silicon, IGZO (In—Ga—Zn—O), or the like. The display region 12a is a region having a plurality of picture elements PIX . . . arranged in a matrix manner. Each of the picture elements PIX includes: a TFT 21, which is a selecting element of the picture element; a liquid crystal capacitor CL, and an auxiliary capacitor Cs. The TFT 21 has its gate terminal connected to a gate bus line GL, its source terminal connected to a source terminal bus line SL, and its drain connected to the liquid crystal capacitor CL and the auxiliary capacitor Cs.

The plurality of gate bus lines GL . . . consist of gate bus lines GL1, GL2, GL3, . . . , GLn, each of which is connected to the output of the gate driver (scanning signal line drive circuit) 15. The plurality of source terminal bus lines SL . . . consist of source terminal bus lines SL1, SL2, SL3, . . . , SLm, each of which is connected to the output of a source terminal driver 16 to be described below. Further, although not illustrated, each of the picture elements PIX . . . is formed with an auxiliary capacitor wire via which to supply an auxiliary capacitor voltage to the auxiliary capacitor Cs of that picture element PIX.

The gate driver 15 is provided in a region on the display panel 12 that is adjacent to one side of the display region 12a in the direction in which the gate bus lines GL . . . extend, and supplies each of the gate bus lines GL . . . with a gate terminal pulse (scanning pulse) in sequence. Furthermore, another gate driver may be provided in a region on the display panel 12 that is adjacent to the other side of the display region 12a in the direction in which the gate bus lines GL . . . extend, so as to scan different gate bus lines GL from the gate driver 15. Alternatively, gate drivers provided in regions that are adjacent to one and the other sides, respectively, of the display region 12a in the direction in which the gate bus lines GL . . . extend may scan the same gate bus lines as each other. These gate drivers are formed monolithically with the display region 12a within the display panel 12, and all gate drivers that are referred to as gate monolithic, gate driverless, panel-built-in gate driver, gate-in-panel, etc. can be encompassed in the gate driver 15.

The flexible printed board 13 includes the source terminal driver 16. The source terminal driver 16 supplies each of the source terminal bus lines SL . . . with a data signal. The source terminal driver 16 may be formed monolithically with the display region 12a within the display panel 12. The control board 14, connected to the flexible printed board 13, supplies signals and power necessary to the gate driver 15 and the source terminal driver 16. Signals and power outputted from the control board 14 that are supplied to the gate driver 15 are supplied from place on the display panel 12 to the gate driver 15 via the flexible printed board 13.

The following describes a configuration of a shift register provided in the gate driver 15.

Figure 3:
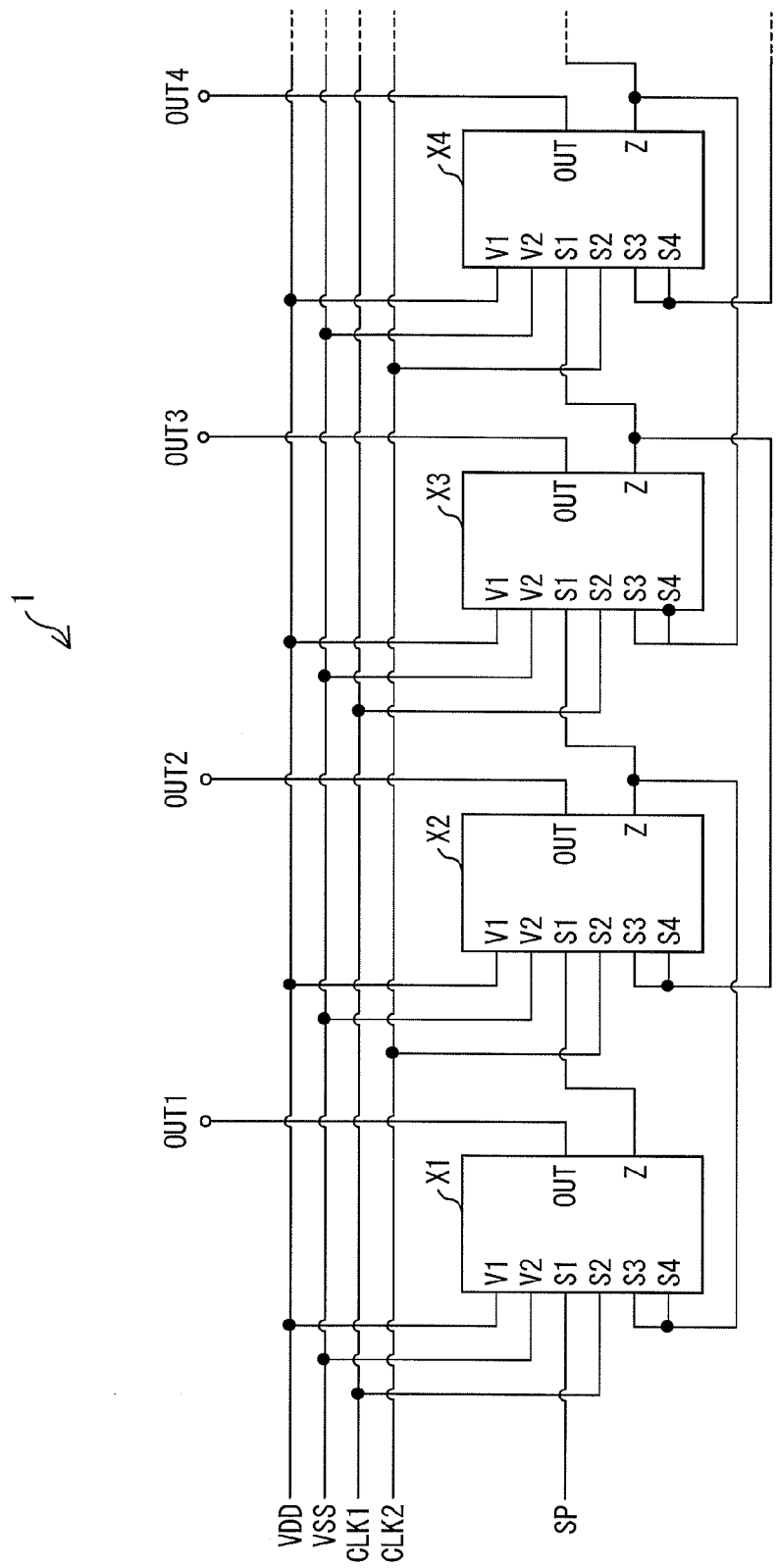
FIG. 3, showing an embodiment of the present invention, is a block diagram showing a configuration of a shift register.

FIG. 3 shows a configuration of the shift register, a shift register 1.

The shift register 1 is configured to have a cascade arrangement of as many stages Xi (where i is a natural number) as the gate bus line GL . . . . Each of the stages Xi includes terminals V1, V2, S1, S2, S3, S4, OUT, and Z. The terminals V1, V2, S1, S2, S3, and S4 are input terminals via which signals and voltages are inputted into the stage Xi, and the terminals OUT and Z are output terminals via which signals are outputted from the stage Xi.

Each of the odd-numbered stages Xi (i=1, 3, 5, . . . ) receives a power supply voltage (first direct-current voltage) VDD at a High level of a gate terminal drive voltage (i.e., a level of a gate terminal pulse) via its terminal (first input terminal) V1, receives a power supply voltage (second direct-current voltage) VSS at a Low level of the gate terminal drive voltage via its terminal (second input terminal) V2, receives an output signal Z (substituted for by the name of the terminal) via its terminal (shift pulse input terminal) S1 from the output terminal (shift pulse output terminal) Z of the previous stage Xi−1, receives a clock signal (first clock signal) CLK1 via its terminal (third input terminal) S2, receives an output signal Z via its terminals (fourth input terminal, fifth input terminal) S3 and S4 from the output terminal Z of the next stage Xi+1, and outputs an output signal OUTi via an output terminal (first output terminal) OUT of the current stage Xi. Note, however, that the stage X1 receives a gate terminal start pulse SP via its terminal S1 instead of receiving an output signal OUTi−1.

Each of the even-numbered stages Xi (i=2, 4, 6, . . . ) receives a power supply voltage (first direct-current voltage) VDD at a High level of the gate terminal drive voltage (i.e., a level of the gate terminal pulse) via its terminal V1, receives the power supply voltage (second direct-current voltage) VSS at a Low level of the gate terminal drive voltage via its terminal (second input terminal) V2, receives the output signal Z via its terminal (shift pulse input terminal) S1 from the output terminal (shift pulse output terminal) Z of the previous stage Xi−1, receives a clock signal (first clock signal) CLK2 via its terminal (third input terminal) S2, receives the output signal Z via its terminals (fourth input terminal, fifth input terminal) S3 and S4 from the output terminal Z of the next stage Xi+1, and outputs an output signal OUTi via an output terminal (first output terminal) OUT of the current stage Xi.

It should be noted that the second direct-current voltage is lower than the first direct-current voltage.

The following describes embodiments of configuration of each stage Xi. It should be noted that the following description assumes that the drain terminal of a field-effect transistor such as a TFT is one drain/source terminal and the source terminal thereof is the other drain/source terminal; however, in the case of use of an opposite channel polarity, the source terminal may be one drain/source terminal and the drain terminal may be the other drain/source terminal.

Embodiment 1

Figure 1:
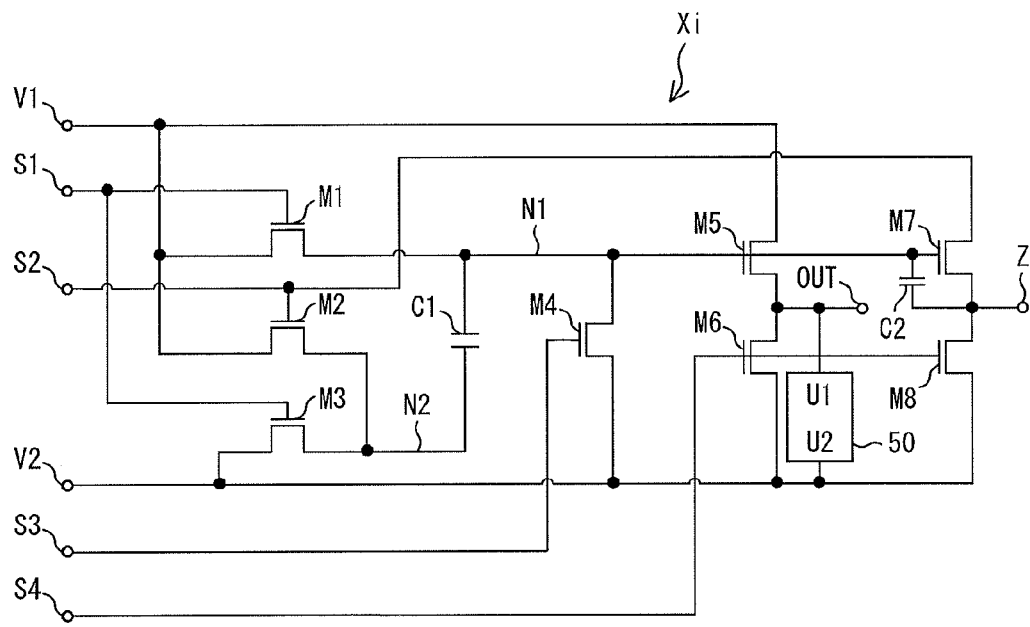
FIG. 1, showing an embodiment of the present invention, is a circuit diagram showing a configuration of a stage provided in a shift register according a first embodiment.

FIG. 1 shows a configuration of each stage Xi according to an embodiment.

The stage Xi includes transistors M1, M2, M3, M4, M5, M6, M7, and M8, capacitors C1 and C2, and a circuit block 50. All of the transistors M1 to M8 here are N-channel TFTs, but it is possible to use P-channel TFTs. The same applies to all transistors of all examples. It should be noted that the gate terminal of each switching element to be described below serves as a control terminal for conduction and disconnection in that switching element.

The capacitor (first capacitor) C1 has one end connected to the gate terminal of the transistor M5 and the source terminal of the transistor M1, with the other end of the capacitor C1 being connected to the source terminal of the transistor M2 and to the drain of the transistor M3. The one end of the capacitor C1 serves as a node N1, and the other end of the capacitor C1 serves as a node N2.

The transistor (input gate) M1 has its gate terminal connected to the terminal S1, its drain connected to the terminal V1, and its source terminal connected to the node N1.

The transistor (first switching element) M2 has its gate terminal connected to the terminal S2, its drain connected to the terminal V1, and its source terminal connected to the node N2, with the other end of the capacitor C1 being connected to the node N2.

The transistor (second switching element) M3 has its gate terminal connected to the terminal S1, its drain connected to the node N2, and its source terminal connected to the terminal V2.

The transistor (third switching element) M4 has its gate terminal connected to the terminal S3, its drain connected to the node N1, and its source terminal connected to the terminal V2.

The transistor (first output transistor) M5 has its drain connected to the terminal V1 and its source terminal connected to the output terminal OUT. That is, to the drain of the transistor M5, a direct-current voltage called power supply voltage VDD is applied, and the source terminal of the transistor M5 functions as a first output terminal that is one output terminal of the stage Xi.

The transistor (fourth switching element) M6 has its gate terminal connected to the terminal S4, its drain connected to the output terminal OUT, and its source terminal connected to the terminal V2.

The transistor (second output transistor) M7 has its gate terminal connected to the node N1, its drain connected to the terminal S2, and its source terminal connected to the output terminal (second output terminal) Z. That is, the transistor M7 has its drain supplied with the first clock signal, and the source terminal of the transistor M7 functions as a second output terminal that is one output terminal of the stage Xi which is different from the first output terminal.

The transistor (fifth switching element) M8 has its gate terminal connected to the terminal S4, its drain connected to the output terminal Z, and its source terminal connected to the terminal V2.

With the output terminal Z connected to the terminal S1 of another stage (the next stage Xi+1 here) to which a shift pulse outputted from the current stage Xi is inputted, the transistor M7 outputs an output pulse from the output terminal Z as a shift pulse. The transistor M8 resets the output terminal Z to a Low level. Further, each of the second and subsequent stages Xi has its output terminal Z connected to the terminals S3 and S4 of another stage (the previous stage Xi−1 here), and the transistor M7 outputs the output pulse from the output terminal Z also as a reset pulse. A reset signal, having the reset pulse, which is inputted to the terminal S3 is a signal indicative of connection and disconnection between the node N1 (first predetermined point) and the terminal V2, and a reset signal, having the reset pulse, which is inputted to the terminal S4 is a signal indicative of connection and disconnection between the output terminal OUT (second predetermined point) and the terminal V2.

The capacitor (second capacitor) C2 has one end connected to the gate terminal of the transistor M7, i.e., to the node N1, with the other end of the capacitor C2 being connected to the source terminal of the transistor M7, i.e., to the output terminal Z.

The circuit block (first circuit) 50, connected between the output terminal OUT and the terminal V2, has a terminal U1 connected to the output terminal OUT and a terminal U2 connected to the terminal V2. The circuit block 50 is a circuit which, if the potential of the output terminal OUT becomes higher than the potential of the terminal V2, forms between the terminal U1 and the terminal U2 a current path though which an electric current flows from the output terminal OUT to the terminal V2 so that the potential of the output terminal OUT comes closer to the potential VSS of the terminal V2, regardless of whether the transistor M5 and the transistor M6 are in an ON state or an OFF state. In each of the examples below, such a current path is called a sink current path because it is a path of a sink current flowing toward the source of the power supply voltage VSS.

A configuration of the circuit block 50 is described in detail in each of the examples below.

Figure 4:
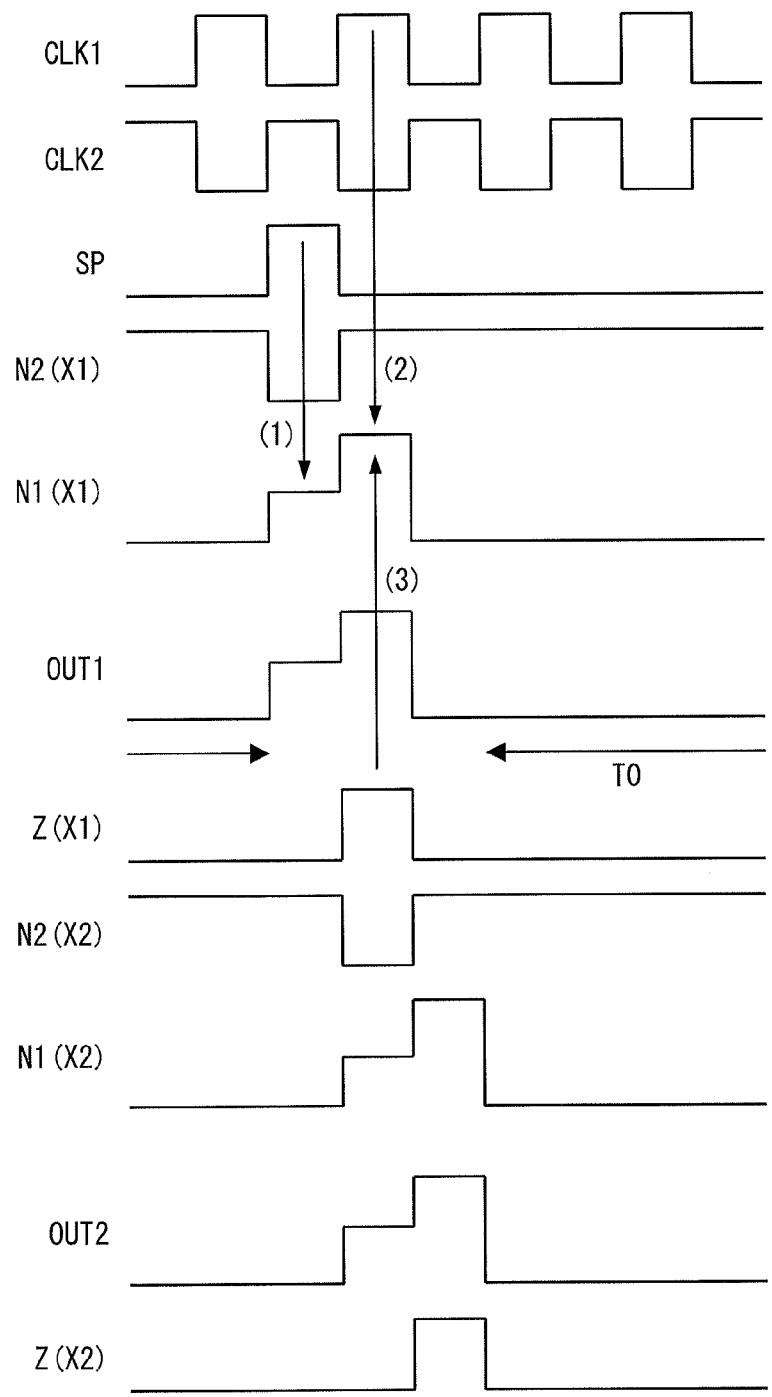
FIG. 4, showing an embodiment of the present invention, is a timing chart showing operation of a shift register.

FIG. 4 shows operating waveforms of the shift register 1.

The clock signal CLK1 and the clock signal CLK2 have their active periods out of overlap with each other. In this example, the clock signal CLK1 and the clock signal CLK2 are opposite in phase to each other. While, in this example, the High level of the clock signals CLK1 and CLK2 is VDD and the Low level is VSS, the High level of the clock signals CLK1 and CLK2 needs only be equal to or higher than VDD and the Low level needs only be equal to or lower than VSS. Further, the clock signals CLK1 and CLK2 and the gate terminal start pulse SP each have a pulse width whose value corresponds to a single horizontal scanning period (1H). The gate terminal start pulse SP is out of phase with the clock signal CLK1 by half a period and corresponds to a single clock pulse of the clock signal CLK2. In this example, with the term "first clock signal" defined as a clock signal that is inputted to the terminal S2, and the clock signal CLK1 corresponds to such a first clock signal in the case of an odd-numbered stage Xi, and the clock signal CLK2 corresponds to such a first clock signal in the case of an even-numbered stage Xi. Moreover, the shift pulse that is inputted to the current stage Xi and the first clock signal have their clock pulses active in periods (High-level periods here) that are out of overlap with each other.

In FIG. 4, the node N1, node N2, output terminal OUT, output signal OUT, output terminal Z, and output signal Z of the stage Xi are denoted as node N1(Xi), node N2(Xi), output terminal OUTi, output signal OUTi, output terminal Z(Xi), and output signal Z(Xi), respectively.

First, when the stage X1 has received the gate terminal start pulse SP as a shift pulse via its terminal S1, the transistors M1 and M3 come into an ON state, so that the stage X1 starts operating. This causes a voltage to be applied to the terminal of the capacitor C1 on the side of the node N1(X1) from the terminal V1 via the transistor M1, and causes the power supply voltage VSS to be applied to the terminal of the capacitor C1 on the side of the node N2 from the terminal V2 via the transistor M3, as indicated by arrow (1). When the capacitor C1 has been charged until the potential of the node N1 becomes (Power Supply Voltage VDD)−(Threshold Voltage Vth of Transistor M1), the transistor M1 comes into an OFF state. As a result, there is a rise in the potential of the node N1 due to the occurrence of a potential difference (Power Supply Voltage VDD)−(Threshold Voltage Vth of Transistor M1)−(Power Supply Voltage VSS) between both ends of the capacitor C1, and this state is retained.

Thus, upon receiving a shift pulse to the current stage Xi, the transistor M1 functions as an input gate that is made conductive by the shift pulse as a conduction control signal in such way as to pass a voltage that is applied to the node N1 for the duration of the shift pulse. The shift pulse is the gate terminal start pulse SP in the case of the stage X1, and is a pulse of an output signal Z(Xi−1) from the previous stage Xi−1 in the case of the other stages Xi.

It should be noted, however, that the magnitude of the power supply voltage VDD is set so that the potential of the node N1(Xi) at this point in time is equal to or higher than the threshold potential of the transistors M5 and M7 and a voltage (voltage of the output signal Z(Xi)) that is inputted the next stage Xi+1 via the terminal S1 as determined by the potential of the node N1(Xi) at this point in time is equal to or lower than the threshold potential of the transistor M1 of the next stage Xi+1. In this example, at a point in time where a shift pulse has been inputted to the terminal S1, the transistor M5 comes into an ON state and the output signal OUT1 has a rising pulse, and the transistor M7 comes into an ON stage and the Low level of the clock signal CLK1 is outputted as the output signal Z(Xi).

Next, a fall in the gate terminal start pulse SP places the transistor M3 in an OFF state.

Next, the clock signal CLK1, which serves as a first clock signal that is inputted from the terminal S2, rises to a High level, whereby the transistor M2 comes into an ON state, and the application of a voltage from the terminal V1 causes the potential of the node N2(X1) to be (Power Supply Voltage VDD)−(Threshold Voltage Vth). This causes the potential of the node N1(X1) to be boosted via the capacitor C1 as indicated by arrow (2). At this point in time, there is a potential difference of VDD−Vth−VSS maintained between both ends of the capacitor C1; therefore, the potential V(N1) of the node N1(X1) is given as V(N1)=(VDD−Vth−VSS)+(VDD−Vth)= 2×VDD−(VSS+2×Vth).

This causes the gate terminal of the transistor M5 to have a sufficiently higher potential V(N1) than VDD, so that the transistor M5 comes into an ON state to have a sufficiently small channel resistance. Therefore, the power supply voltage VDD is outputted from the terminal V1 to the output terminal OUT1 via the transistor M5. The output signal OUT1 serves as a gate terminal pulse with an amplitude of VDD−VSS.

Further, at the same time, the transistor M7 also comes into an ON state to have a sufficiently small channel resistance as with the transistor M5, a pulse at a High level that is an active level of the clock signal CLK1 is outputted from the terminal S2 to the output terminal Z(X1) via the transistor M7. At this point in time, the capacitor C2 functions as a bootstrap capacitor so that the gate terminal potential of the transistor M7 is boosted by a pulse outputted to the transistor M7 via its source terminal. Therefore, the potential V(N1) of the node N1(X1) is determined by the bootstrap effect of the capacitors C1 and C2 as a whole as indicated by arrows (2) and (3). The output signal Z(X1) is inputted as a shift pulse to the next stage Xi+1 via its terminal S1 to charge the capacitor C1 of the stage X2.

Moreover, the potential N1(X2) of the stage X2 is boosted when the High level of the clock signal CLK2, which is a first clock signal, is inputted to the terminal S2, whereby the transistor M5 comes into an ON state. This causes the power supply voltage VDD to be outputted as an output signal OUT2 from the output terminal OUT2 via the transistor M5 to serve as a gate terminal pulse. Since the transistor M7 also comes into an ON state, an active pulse of the clock signal CKL2 inputted from the terminal S2 is outputted to the output terminal Z(X2) via the transistor M7. The output signal Z(X2) is inputted as a shift pulse to the next stage X3 via its terminal S1. Further, the output signal Z(X2) is inputted to the previous stage X1 via its terminals S3 and S4, and the transistors M4 and M6 come into an ON state, whereby the potential of the node N1(X1) and output terminal OUT1 of the previous stage X1 fall to the power supply voltage VSS. This causes the gate terminal pulse as the output signal OUT1 to fall, whereby the stage X1 is reset.

The output signal Z(Xi) from the second or subsequent stage Xi is inputted to the terminals S3 and S4 of the previous stage Xi−1, whereby the node N1(Xi−1) and the output terminal OUTi−1 of the previous stage Xi−1 are reset to a Low level, that is, the previous stage Xi−1 is reset.

In this way, gate terminal pulses are outputted as output signals OUTi in sequence to each gate bus line GL.

Further, every time the output signal Z(i+1) inputted as a reset signal to each stage Xi via its terminals S3 and S4 from the next stage becomes active for each frame, the transistor M6 comes into an ON state and the output terminal OUTi is dropped to a Low level. Since there is no next stage for the final stage, it is only necessary to provide a dummy stage or the like equivalent in configuration to the other stages to input a reset signal similar to those which are inputted to the other stages.

During a period T0 from a point in time where the stage Xi was reset by a reset signal and a point in time where the stage Xi next receives a shift pulse, the transistor M6 stays in an OFF state. The period T0 is normally substantially a single frame period in the display device. Therefore, suppression of a rise in potential by the circuit block 50 is carried out so that an unwanted rise in potential is not caused in the period T0 by floating of the gate bus line GL connected to the output terminal OUTi.

Figure 2:
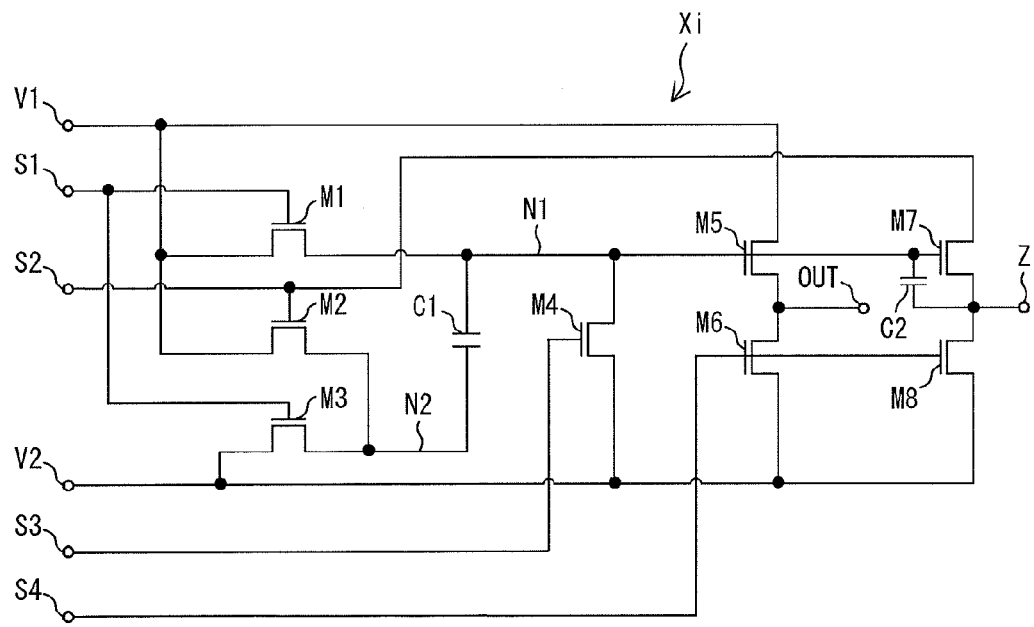
FIG. 2 is a circuit diagram showing a configuration of a stage that is a comparative example of the stage of FIG. 1.

Let it be assumed that as shown in FIG. 2, the shift register 1 includes no circuit block 50. In this case, as shown in (a) of FIG. 5, the start of a period T0 after the passage of a period T1 during which a pulse is outputted as the output signal OUTi and a period T2 during which an active reset signal is inputted to the stage Xi tends to result in a rise in potential of the output signal OUTi as indicated by a broken line. During the period T0, the transistors M5 and M6 are both in an ON state, and the output terminal OUTi has its potential retained by the capacitance of the gate bus line GL. Once the period T0 starts, the potential of the output terminal OUTi gradually rises from VSS due to leak currents present in the transistors M5 and M6 and settles at a final potential. The final potential is determined by a voltage division ratio for the potential difference (substantially equal to VDD−VSS) between the terminal V1 and the terminal V2 as based on the respective OFF resistances of the transistors M5 and M6 constituted by TFTs. If the final potential is high, the TFTs 21 of the picture elements PIX connected to the gate bus line GL become conductive even though those picture elements PIX are in a non-selection period, with the result that the display data being retained in the picture elements PIX is rewritten by the display data of another row. Therefore, it is a must to minimize a rise in potential of the output terminal OUTi during the period T0.

Accordingly, it is effective to take measures to make the final potential closer to the potential of the terminal V2. This objective may be achieved by setting the voltage division ratio so that the proportion of the resistance of the transistor M6 to the series resistance of the transistors M5 and M6 becomes smaller. In this case, however, it is necessary to make the size (channel width) of the transistor M6 considerably large. From the viewpoint of saving space in the display device, reducing driving power, avoiding a decrease in yield of element fabrication, suppressing an extreme increase in leak current, etc., it is impossible to freely make the size large. This makes it necessary to adjust the time constant of a rise in potential by setting element constants such as the values of resistance of the transistors M5 and M6 and of the capacitance value of the gate bus line while minimizing the size so that a rise in potential of the gate bus line GL finally falls within the allowable range in the length of the period T0, which is a single frame period.

However, changes in the threshold voltages of the TFTs due to variations in the characteristics of the TFTs or the application of bias during operation easily lead to a change in the time constant by breaking down the balance between the leak currents of the transistors M5 and M6. This makes it difficult to sufficiently prevent a rise in potential of the gate bus line GL to such an extent as to select the picture elements PIX in a non-selection period, thus causing a defective display.

Accordingly, the present embodiment provides the circuit block 50 shown in FIG. 1 so that a sink current path is formed in the circuit block 50 whenever the potential of the output terminal OUTi becomes higher than the potential of the terminal V2. Once a sink current path is formed, a sink current flows from the output terminal OUTi to the terminal V2, so that the potential of the output terminal OUTi can be made closer to the potential of the terminal V2.

Figure 5:
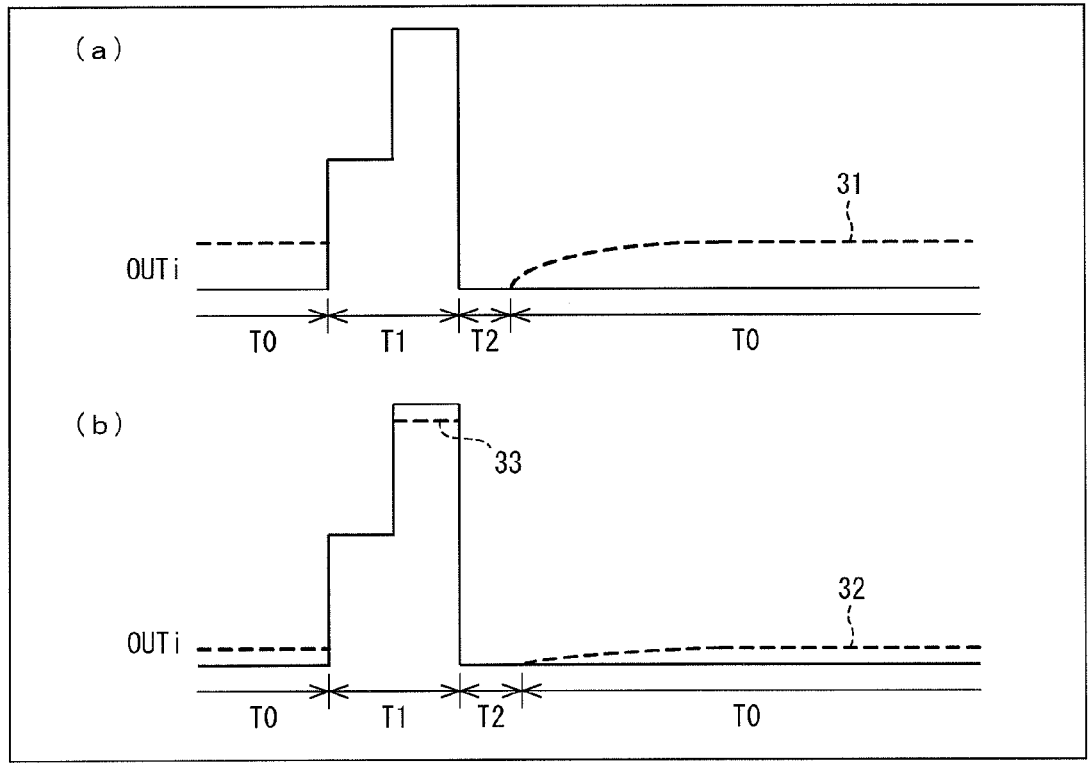
FIG. 5, showing an embodiment of the present invention, is a set of diagrams each showing (a) and (b) showing operation of a shift register, (a) being a waveform chart showing operation of a shift register including the stage of FIG. 2, (b) being a waveform chart showing operation of a shift register including the stage of FIG. 1.

Therefore, as shown in (b) of FIG. 5, the shape of potential indicated by a broken line 32 rising at the start of a period T0 after a period T2 is closer to the power supply voltage VSS than the shape of potential indicated by a broken line 31 of (a) of FIG. 5. This makes it possible to appropriately suppress a rise in potential of the gate bus line GL even without making the size of the transistor M6 large. As will be described in the embodiments below, since in the present embodiment the formation of a sink current path by the circuit block 50 is carried out whenever the potential of the output terminal OUTi becomes higher than the potential of the terminal V2, a sink current flows from the terminal OUTi to the terminal V2 even in a period T1 during which the pulse of the output signal OUTi is outputted. This results in a decrease in potential of the pulse of the output signal OUTi during the period T1 as indicated by a broken line 33 in (b) of FIG. 5, but this decrease is such that the potential of the pulse of the output signal OUTi can be confined within an appropriate range by adjusting the value of resistance of the sink current path. Since the magnitude of a sink current can be set to an appropriate level by adjusting a value of resistance, the circuit block 50 functions to appropriately retain the potentials of the output terminal OUTi and the gate bus line GL during the period T0 without adding a component for detecting the potentials of the output terminal OUTi and the gate bus line GL or adding a component for controlling conduction and disconnection between (i) the output terminal OUTi and the gate bus line GL and (ii) the terminal V2.

As described above, according to the present embodiment, a fluctuation in output voltage that occurs in a case where the transistor M5 receives a clock signal via its drain and a leakage of electric charges from liquid crystal picture element electrodes that occurs due to the fluctuation in output voltage can be prevented by applying a first direct-current voltage called power supply voltage VDD to the drain (end opposite to the gate terminal drive output side) of the transistor M5 outputting a gate terminal pulse and carrying out a switched capacitor operation using the transistors M2 and M3 and the capacitor C1.

Further, the application of the direct-current voltage to the drain of the transistor M5 makes it possible to drive the gate bus line by a direct-current power supply, thus making it possible to significantly reduce the load on an external level shifter that generates a control signal for the shift register, as compared to a case where the gate bus line is driven with a clock signal by inputting the clock signal to the transistor M5 via its drain.

The application of the direct-current voltage to the drain of the transistor M5 lengthens the duration of application of negative bias between the gate terminal and drain of the transistor M5, thus making it possible to reduce a rise in threshold voltage. By not driving the gate bus line with a clock signal, the amplitude of the clock signal can be set to any value with the Low level being equal to or lower than VSS and the High level being equal to or higher than VDD. In a case where the High level is a value higher than VDD, there is an increase in ON current of the transistor receiving the High level via its gate terminal, so that an improvement in operation speed becomes possible. In a case where the Low level is a value lower than VSS, there is a decrease in OFF current of the transistor receiving the Low level via its gate terminal, so that the occurrence of a malfunction in the level shifter due to a leak current can be prevented.

Further, in a case where the Low level is a value lower than VSS, the gate terminal potential can be made lower than the source terminal potential and the drain potential. Therefore, a change in the threshold voltage Vth over time due to a direct-current voltage component applied to the gate terminal can be held small. This makes it possible to prevent deterioration in performance of the shift register.

Further, in the present embodiment, a stage for outputting the gate terminal pulse and a stage for outputting set and reset control signals such as a set signal (shift pulse) and a reset signal to another stage Xi are separate from each other. It should be noted that any number of stages that are further separate in a similar fashion may be provided.

Further, as for the control signals, interference between the output of a set signal and the output of a reset signal can be avoided by further separating a stage for outputting a set signal (shift pulse) to another stage and a stage for outputting a reset signal to another stage, so that a more stable operation is achieved. In this case, a third output transistor similar to the transistor M7 and a ninth switching element similar to the transistor M8 are added, for example, to the configuration of FIG. 1. With the source terminal of the third output transistor functioning as a third output terminal that is one output terminal of the stage Xi which is different from the first output terminal and the second output terminal, the stage Xi outputs a set signal (shift pulse) via the second output terminal (output terminal Z) and a reset signal via the third output terminal.

Such a connection, to the terminal S2, of the drain of the transistor M7 outputting controls signals for setting and resetting the previous or subsequent stage Xi can prevent the potential V(N1) of the node N1 from being boosted by capacity coupling to cause a rise in potential of the output terminal Z.

Figure 22:
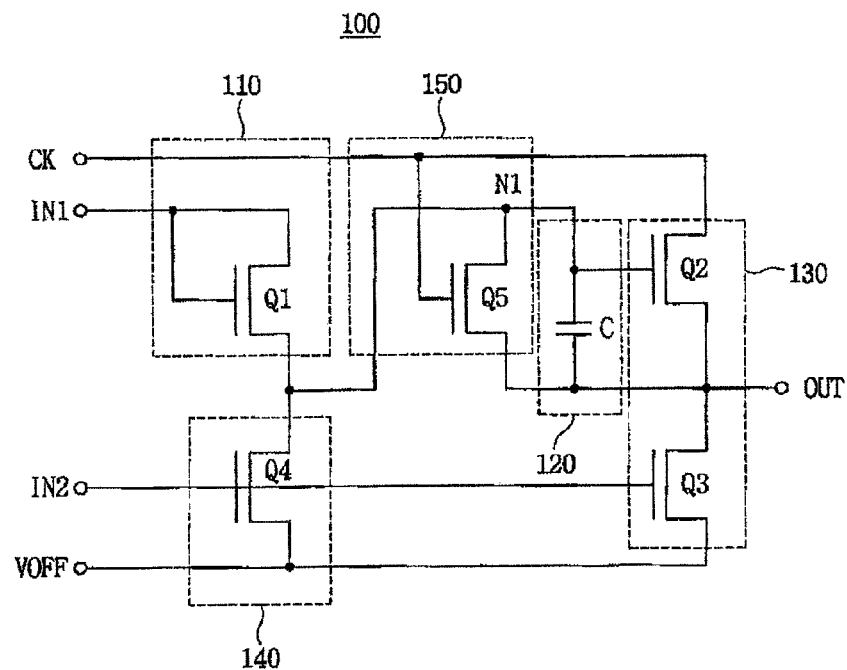
FIG. 22, showing a conventional technology, is a circuit diagram showing a first example configuration of a stage provided in a shift register.
Figure 23:
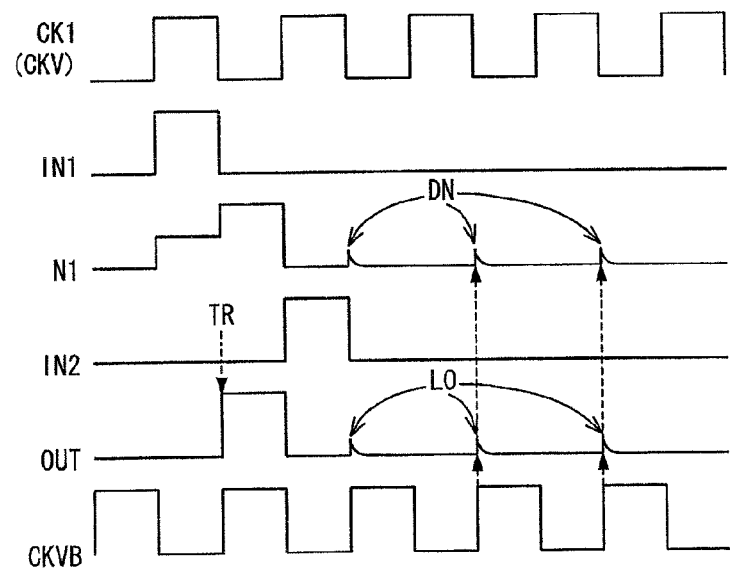
FIG. 23 is a first waveform chart for explaining problems with a conventional shift register.

Further, the present embodiment is configured such that the transistor M6 receives an output from the subsequent stage via its gate terminal. In the circuit configuration of Patent Literature 1, the output transistor Q2 of FIGS. 22 and 25 receives a clock signal via its drain; therefore, there occurs a fluctuation in output for each clock due to clock feed-through. Therefore, it is necessary to use the clock signal as a control signal for the transistor Q3 in order to suppress such a fluctuation in output.

On the other hand, in the case of input of a direct-current voltage to the drain of the transistor M5 as in the present embodiment, there occurs no noise in the output terminal OUT for each clock. This makes possible an operation of inputting an output pulse from the subsequent stage as a control pulse to the gate terminal of the transistor M6 only once to cause the output terminal OUT to retain Low until the time of gate driver output of the next frame.

By thus inputting an output from the subsequent stage to the gate terminal of the transistor M6, the fear of occurrence of clock feed-through or a phenomenon of shift in threshold voltage due to the input of a clock signal to the gate terminal is wiped out. This makes it possible to satisfactorily prevent a fluctuation in potential of the output terminal OUT during a period up to the next output from the stage via the output terminal OUT.

Further, a direct-current voltage different from the first direct-current voltage may be applied to the gate terminal of the transistor M1. This prevents the charging potential of the node N1 from being restricted by the power supply voltage VDD.

Further, as shown in FIG. 4, with such settings that a shift pulse is inputted via the terminal S1 and the transistor M5 comes into an ON state due to the potential (VDD−Vth) of the node N1, the gate terminal pulse that is outputted via the output terminal OUT is outputted for the duration of two clock pulses (the period T1 of FIG. 5) while rising in potential stepwise as indicated by the waveform of the output signal OUT1. Meanwhile, as indicated by the waveforms of the output signals Z(X1) and Z(X2), a shift pulse outputted via the output terminal Z is only outputted for the duration of one clock pulse of the clock signal CLK1 or CLK2 which corresponds to the second-half period of the gate terminal pulse of the current stage Xi. This makes it possible to precharge the picture elements in the first half period of the gate terminal pulse and formally write data signals in the second-half period, and to transmit a shift pulse to the next state Xi+1.

Therefore, the shift register 1 makes it possible to reduce the number of clock signals serving as input signals necessary for obtaining equivalent output signals for precharging.

Thus, the shift register 1, which carries out the driving of FIG. 4, can prevent the potential V(N1) of the node N1 from being boosted by capacitor coupling to cause a rise in output of the output terminal Z when such a rise is not needed and consequently cause a malfunction in the shift register. Further, the number of necessary external input signals to the shift register can be reduced.

Unlike in the case of the driving of FIG. 4, such a configuration is possible that the transistor M5 stays in an OFF state at a point in time where a shift pulse is inputted via the terminal S1 and the potential of the node N1 becomes VDD−Vth, and comes into an ON state only in the second half of the period T1 during which an active pulse of the first clock to the terminal S2 is inputted.

Alternatively, in the present embodiment, the transistors M1 to M8 that are used in the stage Xi may be p-channel transistors.

Alternatively, the stage Xi may be configured such that there exists no capacitor C2, or such that there exists no transistor M7 or M8 or no output terminal Z, for example. In the absence of an output terminal Z, the output terminal OUT serves as a shift pulse output terminal via which to output a shift pulse to be transmitted to the next stage Xi.

In the following, a configuration of the circuit block 50 is described in detail by taking each of the examples below.

Example 1

Figure 6:
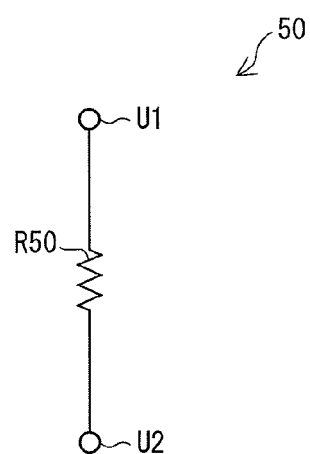
FIG. 6, showing an embodiment of the present invention, is a circuit diagram showing a configuration of a first circuit of a first example of the first embodiment.

FIG. 6 shows a configuration of an example of a circuit block 50.

The circuit block 50 of FIG. 6 is constituted by a resistor (first resistor) R50. The resistor R50 is a resistance element having one end connected to the terminal U1 and the other end connected the terminal U2.

The resistor 50 can form a sink current path because an electric current flows from the terminal U1 to the terminal U2 when the potential of the terminal U1 becomes higher than the potential of the terminal U2.

The resistor R50 can be formed by a metal layer forming wires of the display panel 12 and electrodes such as the source terminals/drains and gates terminal of the TFTs.

Alternatively, the resistor R50 can be formed by a semiconductor layer forming the TFTs.

Alternatively, the resistor R50 can be formed by a transparent electrode material for the picture elements PIX.

Example 2

Figure 7:
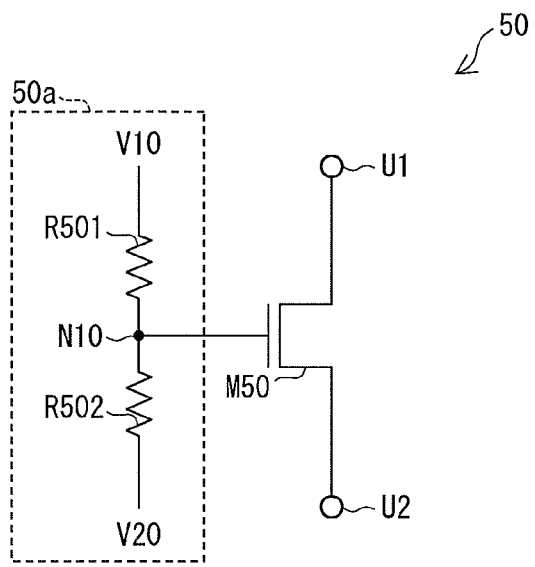
FIG. 7, showing an embodiment of the present invention, is a circuit diagram showing a configuration of a first circuit of a second example of the first embodiment.

FIG. 7 shows a configuration of an example of a circuit block 50.

The circuit block 50 of FIG. 7 includes a transistor M50 and a circuit block 50a. The circuit block 50a includes resistors R501 and R502.

The transistor (first transistor) M50 is constituted by a field-effect transistor such as a TFT. In FIG. 7, the transistor M50 is an n-channel transistor, and has its drain connected to the terminal U1 and its source terminal connected to the terminal U2. In the description of each of the examples, it is assumed that the drain means one drain/source terminal and the source terminal means the other drain/source terminal.

The circuit block 50a is a circuit that defines the conductance of the transistor M50, and includes a node N10 connected to the gate terminal of the transistor M50. The resistor (second resistor) R501 is a resistance element having one end connected to the node N10 and the other end to which a direct-current voltage (first voltage) V10 is applied. The resistor (third resistor) R502 is a resistance element having one end connected to the node N10 and the other end to which a direct-current voltage (second voltage) V20 is applied. It is assumed here that the relationship V10>V20 holds when a sink current path is formed in the circuit block 50. Therefore, the first voltage and the second voltage do not need to be direct-current voltages as long as the relationship holds. For example, it may be that the voltage V10 is at a High level (V10>V20) only when the terminal U1 is at a High level (e.g., at the time of gate pulse output in the display device) and at a Low level (at which the high-low relationship between V10 and V20 is not defined) in the other periods.

A voltage obtained by dividing the difference between the voltage V10 and the voltage V20 by the resistors R501 and R502 appears at the node N10, and this divided voltage is applied as a bias voltage to the gate terminal of the transistor M5. At this point in time, the potential difference between the node N10 and the terminal U2 (substantially equal to the power supply voltage VSS) is set to exceed the threshold voltage of the transistor M50. Because an electric current flows from the terminal U1 to the terminal U2 when the potential of the terminal U1 becomes higher than the potential of the terminal U2, a sink current path can be formed. Because the transistor M50 operates in a linear region in a range where the potential difference between the terminal U1 and the terminal U2 is small, the transistor M50 functions as an element having a substantially constant value of resistance. Even if an increase in potential of the terminal U1 in the period T1 causes the transistor M50 to operate in a saturation region (constant-current region), the sink current can be held small by setting the node N10 at a low voltage in advance.

The resistors R501 and R502 can be formed by a metal layer forming wires of the display panel 12 and electrodes such as the source terminals/drains and gates terminal of the TFTs.

Alternatively, the resistors R501 and R502 can be formed by a semiconductor layer forming the TFTs.

Alternatively, the resistors R501 and R502 can be formed by a transparent electrode material for the picture elements PIX.

The TFTs can be formed by polysilicon (including low-temperature polysilicon), CG silicon, IGZO (In—Ga—Zn—O), or the like, as well as amorphous silicon.

Figure 8:
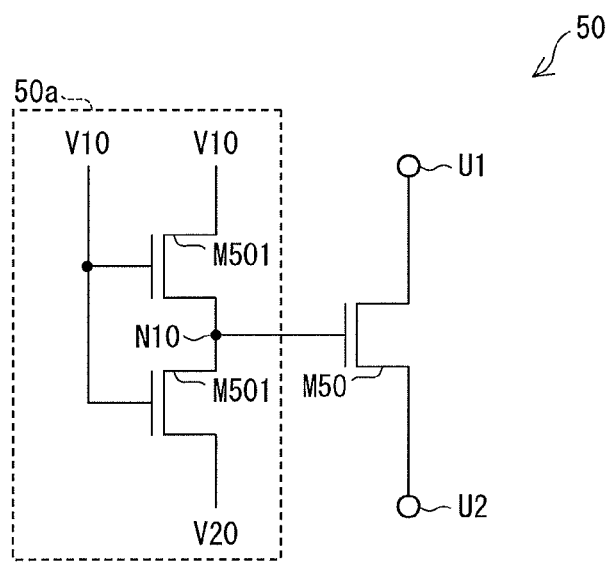
FIG. 8, showing an embodiment of the present invention, is a circuit diagram showing another configuration of the first circuit of the second example of the first embodiment.

Further, as shown in FIG. 8, the resistors R501 and R502 can be constituted by transistors M501 and M502 constituted by field-effect transistors such as TFTs. The transistors M501 and M502 here are n-channel transistors. With the voltage V10 applied to the drain of the transistor (second transistor) M501, the transistor M501 has its source terminal connected to the node N10. The transistor (third transistor) M502 has its drain connected to the node N10, with the voltage V20 being applied to the source terminal of the transistor M502. To the respective gate terminals of the transistors M501 and M502, the voltage V10 is applied as a bias voltage. The transistors M501 and M502 operate in a linear region.

Further, in FIG. 8, the bias voltage that is applied to the gate terminals of the transistors M501 and M502 may be such a voltage that the transistors M501 and M502 come into an OFF state. At this point in time, a leak current in a subthreshold region flows equally through the transistors M501 and M502, so that the voltage of the node N10 becomes a voltage obtained by dividing V1–V2 by the transistors M501 and M502 in an OFF state. In this case, a low bias voltage that places the transistors M501 and M502 in an OFF state is applied to the gate terminals of the transistors M501 and M502; therefore, the transistors M501 and M502 are unlikely to deteriorate.

Further, in FIG. 8, the voltage that is applied to the gate terminals of the transistors M501 and M502 may be such a voltage that either of the transistors M501 and M502 comes into an ON state and the other one of the transistors M501 and M502 comes into an OFF state. A voltage based on the state of application of a voltage to the transistor in an ON state is applied to the node N10.

It should be noted that the transistors, M50, M501, and M502 may be constituted by p-channel field-effect transistors. The TFTs can be formed by polysilicon (including low-temperature polysilicon), CG silicon, IGZO (In—Ga—Zn—O), or the like, as well as amorphous silicon.

Further, in a case where the transistor M50 used is a TFT having a comparatively large leak current, the current control of the transistor M50 by the circuit block 50a in the subthreshold region may be carried out by using leak current characteristics.

Example 3

Figure 9:
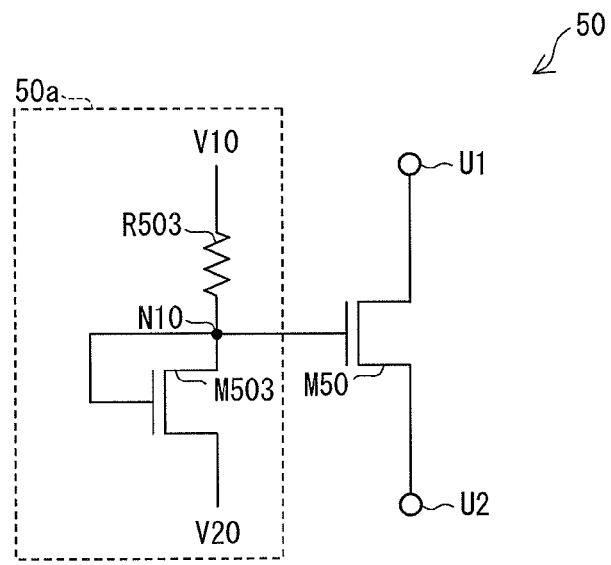
FIG. 9, showing an embodiment of the present invention, is a circuit diagram showing a configuration of a first circuit of a third example of the first embodiment.

FIG. 9 shows a configuration of an example of a circuit block 50.

The circuit block 50 of FIG. 9 is obtained by configuring the circuit block 50 of FIG. 7 such that the circuit block 50a includes a resistor R503 and a transistor M503.

The resistor (fourth resistor) R503 is a resistance element having one end connected to the node N10 and the other end to which the voltage V10 is applied. The transistor M503 is an n-channel transistor. The transistor (fourth transistor) M503 has its gate terminal and drain diode-connected by being connected to the node N10, with the voltage V20 being applied to the source terminal of the transistor M503.

The transistor M503 operates at a pinch-off point because it has its gate terminal and drain connected to each other. Therefore, the voltage of the node N10 is determined at a point where the sum of a drop in voltage due to a drain current of the transistor M503 flowing through the resistor R503 and the drain/source terminal voltage (pinch-off voltage) of the transistor M50 is equal to V10–V20. This voltage of the node N10 is applied to the gate terminal of the transistor M50, so that the transistor M50 operates in the same manner as in Example 2.

If (Voltage of Node N10)–V20 is smaller than the threshold voltage Vth of the transistor M503, the transistor M503 comes into an OFF state in which it is possible to pass a leak current in the subthreshold region. With use of this, the voltage of the node N10 may be made a voltage obtained by a drop in voltage from the voltage 10 due to a leak current of the transistor M503 flowing through the resistor R503. Because a low bias voltage that places the transistor M503 in an OFF state is applied to the gate terminal of the transistor M503, the transistor M503 is unlikely to deteriorate.

The resistor R503 can be formed by a metal layer forming wires of the display panel 12 and electrodes such as the source terminals/drains and gates terminal of the TFTs.

Alternatively, the resistor R503 can be formed by a semiconductor layer forming the TFTs.

Alternatively, the resistor R503 can be formed by a transparent electrode material for the picture elements PIX.

It should be noted the transistors M50 and M503 may be constituted by p-channel field-effect transistors. In a case where the transistor M503 used is a p-channel transistor, the transistor M503 is placed on the side of the voltage V10 and the resistor R503 is placed on the side of the voltage V20.

Further, in a case where the transistor M50 used is a TFT having a comparatively large leak current, the current control of the transistor M50 by the circuit block 50a in the subthreshold region may be carried out by using leak current characteristics.

The TFTs can be formed by polysilicon (including low-temperature polysilicon), CG silicon, IGZO (In—Ga—Zn—O), or the like, as well as amorphous silicon.

Example 4

Figure 10:
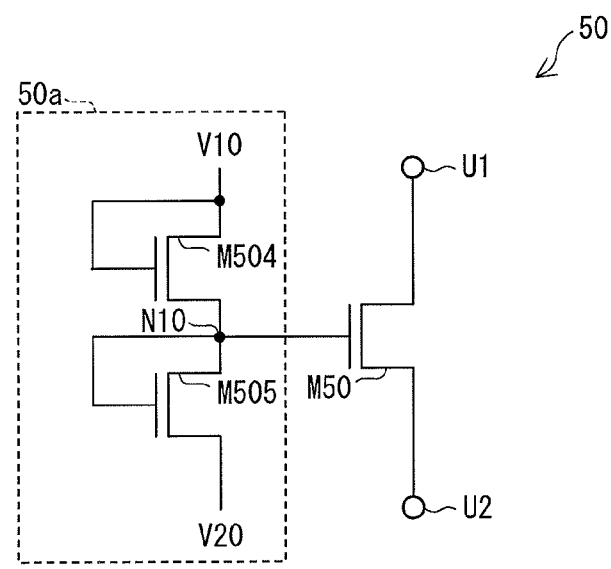
FIG. 10, showing an embodiment of the present invention, is a circuit diagram showing a configuration of a first circuit of a fourth example of the first embodiment.

FIG. 10 shows a configuration of an example of a circuit block 50.

The circuit block 50 of FIG. 10 is obtained by configuring the circuit block 50 of FIG. 7 such that the circuit block 50a includes a transistor M504 and a transistor M505.

With the voltage V10 applied to the gate terminal and drain of the transistor (fifth transistor) M504, the transistor M504 has its source terminal connected to the node N10. The transistor (sixth transistor) M505 has its gate terminal and drain connected to the node N1, with the voltage V20 being applied to the source terminal of the transistor M505. Therefore, the transistors M504 and M505 are diode-connected.

Each of the transistors M504 and M505 operates at a pinch-off point because it has its gate terminal and drain connected to each other. Therefore, the voltage of the node N10 is determined at a point where the sum of the drain/source terminal voltage (pinch-off voltage) of the transistor M504 and the drain/source terminal voltage (pinch-off voltage) of the transistor M505 is equal to V10–V20. This voltage of the node N10 is applied to the gate terminal of the transistor M50, so that the transistor M50 operates in the same manner as in Example 2.

If V10–(Voltage of Node N10) is smaller than the threshold voltage Vth of the transistor M504 or (Voltage of Node N10)–V20 is smaller than the threshold voltage Vth of the transistor M505, the transistors M504 and M505 can come into a state in which to pass a leak current in the subthreshold region. With use of this, the voltage of the node N10 may be made a voltage obtained by dividing V10–V20 by the transistors M504 and M505 in an OFF state. Because a low bias voltage that places the transistors M504 and M505 in an OFF state is applied to the gate terminals of the transistors M504 and M505, the transistors M504 and M505 are unlikely to deteriorate.

Further, since it is only necessary to apply a bias voltage of the gate terminal of the transistor M504, it is possible to apply the power supply voltage VDD to the gate terminal of the transistor M504. As for the transistor M505 of FIG. 10, the voltage of the node N10 needs to be higher than V20+ (Threshold Voltage Vth of Transistor M505) so that the transistor M505 is held in an ON state. Therefore, in order to make the voltage of the node N10 high, it is effective to, by making the gate terminal voltage of the transistor M504 sufficiently high, cause the transistor M504 to operate in such a linear region that the drain/source terminal voltage is considerably small, and it is preferable to apply the power supply voltage VDD to the gate terminal of the transistor M504.

Further, the power supply voltage VSS may be applied to the gate terminal of the transistor M504. This places the transistor M504 in an OFF state, so that a leak current in the subthreshold region flows. In this case, a low bias voltage is applied to the gate terminal of the transistor M504; therefore, the transistor M504 is unlikely to deteriorate. The transistor M505 used here is one characterized to give a predetermined voltage to the gate terminal of the transistor M50 while passing a leak current or a drain current equal in magnitude to the leak current of the transistor M504. The voltage of the node N10 is a voltage obtained by dividing V10–V20 by the transistor M504 and the transistor M505.

Further, the transistor M504 may be made to have its gate terminal supplied with a voltage having an overdrive voltage smaller than the power supply voltage VDD, so as to be given a desired ON resistance. This causes the transistor M504 to operate in the middle of the linear region, thus making it possible to easily select a given value of resistance and to easily pass the same drain current as the transistor M505 having a drain/source terminal voltage serving as a pinch-off voltage.

Further, the transistor M504 may be made to have its gate terminal connected to the node N10. This allows the transistor N504 to operate in a saturation region.

It should be noted that the transistors, M50, M504, and M505 may be constituted by p-channel field-effect transistors. The TFTs can be formed by polysilicon (including low-temperature polysilicon), CG silicon, IGZO (In—Ga—Zn—O), or the like, as well as amorphous silicon.

Further, in a case where the transistor M50 used is a TFT having a comparatively large leak current, the current control of the transistor M50 by the circuit block 50a in the subthreshold region may be carried out by using leak current characteristics.

Example 5

FIG. 11 shows a configuration of an example of a circuit block 50.

The circuit block 50 of FIG. 11 is obtained by configuring the circuit block 50 of FIG. 7 such that the circuit block 50a includes a resistor R504 and transistors M506 and M507.

The resistor (fifth resistor) R504 is a resistance element having one end connected to the node N10 and the other end to which the voltage V10 is applied. The transistors M506 and M507 are n-channel transistors. The transistor (sixth transistor) M506 has its gate terminal and drain connected to the node N10 and its source terminal connected to the gate terminal and drain of the transistor (seventh transistor) M507, with the voltage V20 being applied to the source terminal of the transistor M507. Therefore, the transistors M506 and M507 are diode-connected.

In the foregoing configuration, either the transistors M506 and M507 both operate at a pinch-off point, or the transistors M506 and M507 both come into an OFF state in which to pass a leak current in the subthreshold region, and the voltage of the node N10 as obtained by a drop in voltage from the voltage V10 due to the drain current flowing through the resistor R504 at the time is applied to the gate terminal of the transistor M50. The transistor M50 operates in the same manner as in Example 2. In a case where the transistors M506 and M507 are both in an OFF state, a low bias voltage that places the transistors M506 and M507 in an OFF state is applied to the gate terminals of the transistors M506 and M507; therefore, the transistors M506 and M507 are unlikely to deteriorate.

The resistor R504 can be formed by a metal layer forming wires of the display panel 12 and electrodes such as the source terminals/drains and gates terminal of the TFTs.

Alternatively, the resistor R504 can be formed by a semiconductor layer forming the TFTs.

Alternatively, the resistor R504 can be formed by a transparent electrode material for the picture elements PIX.

It should be noted that the transistors, M50, M506, and M507 may be constituted by p-channel field-effect transistors. The TFTs can be formed by polysilicon (including low-temperature polysilicon), CG silicon, IGZO (In—Ga—Zn—O), or the like, as well as amorphous silicon.

Further, in a case where the transistor M50 used is a TFT having a comparatively large leak current, the current control of the transistor M50 by the circuit block 50a in the subthreshold region may be carried out by using leak current characteristics.

Example 6

Figure 12:
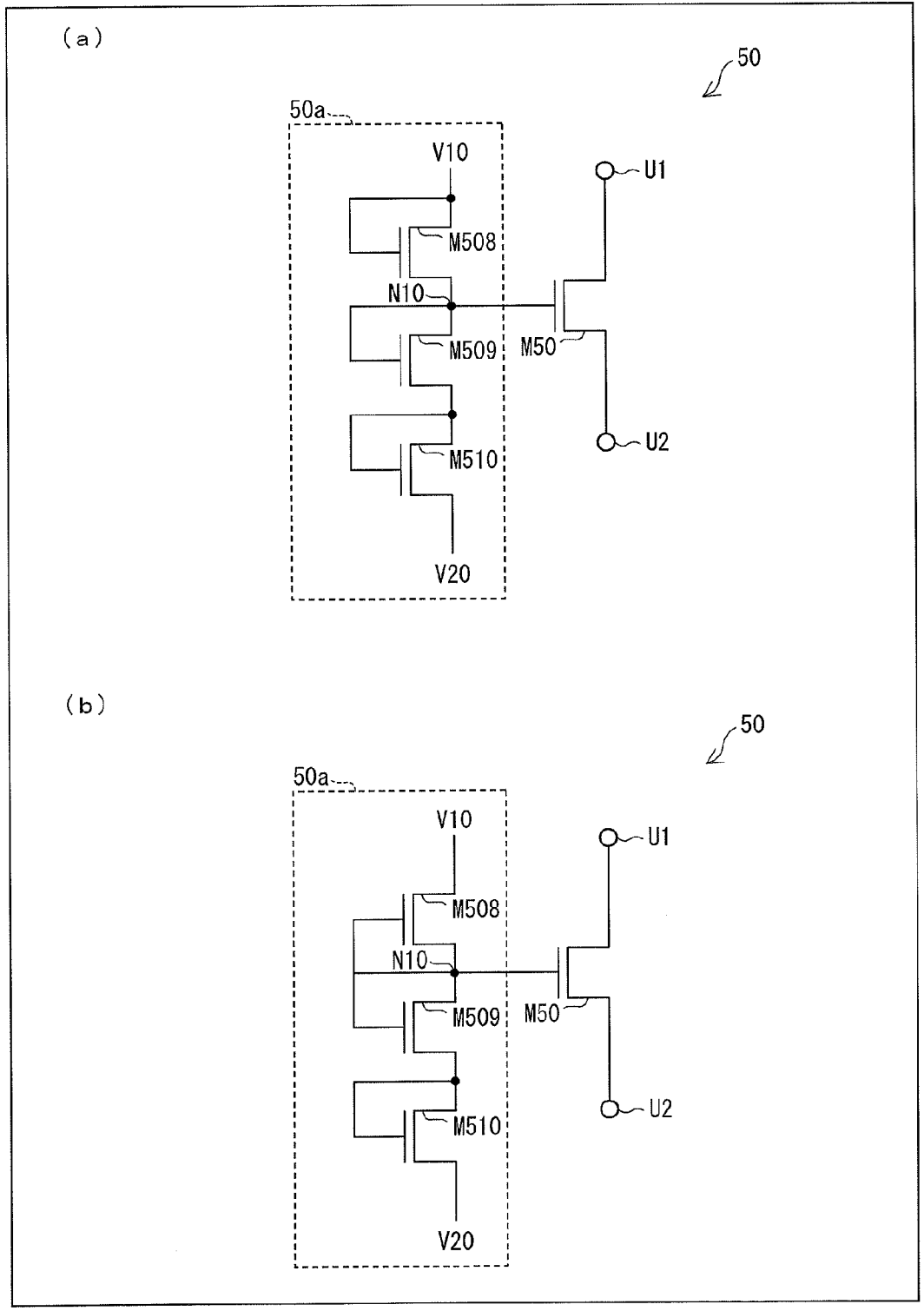
FIG. 12, showing an embodiment of the present invention, is a set of circuit diagrams (a) and (b) each showing a configuration of a first circuit of a sixth example of the first embodiment, (a) being a circuit diagram showing a first configuration of the first circuit, (b) being a circuit diagram showing a second configuration of the first circuit.

(a) of FIG. 12 shows a configuration of an example of a circuit block 50.

The circuit block 50 of (a) of FIG. 12 is obtained by configuring the circuit block 50 of FIG. 7 such that the circuit block 50a includes transistors M508, M509, and M510.

With the voltage V10 applied to the gate terminal and drain of the transistor (eighth transistor) M508, the transistor M508 has its source terminal connected to the node N10. The transistor (ninth transistor) M509 has its gate terminal and drain connected to the node N10 and its source terminal connected to the gate terminal and drain of the transistor (tenth transistor) M510, with the voltage V20 being applied to the source terminal of the transistor M510. Therefore, the transistors M508, M509, and M510 are diode-connected.

In the foregoing configuration, either the transistors M508, M509, and M510 all operate at a pinch-off point, or the transistors M508, M509, and M510 all come into an OFF state in which to pass a leak current in the subthreshold region, and a voltage divided by each transistor at the time appears at the node N10. This voltage of the node N10 is applied to the gate terminal of the transistor M50, so that the transistor M50 operates in the same manner as in Example 2. In a case where the transistors M508, M509, and M510 are all in an OFF state, a low bias voltage that places the transistors M508, M509, and M510 in an OFF state is applied to the gate terminals of the transistors M508, M509, and M510; therefore, the transistors M508, M509, and M510 are unlikely to deteriorate.

Further, since it is only necessary to apply a bias voltage to the transistor M508, it is possible to apply the power supply voltage VDD to the gate terminal of the transistor M508. As for the transistor M510 of FIG. 12, the voltage of the drain of the transistor M510 needs to be higher than V20+(Threshold Voltage Vth of Transistor M509) so that the transistor M510 is held in an ON state. As for the transistor M509, the voltage of the node N10 needs to be higher than (Voltage of Drain of Transistor M510)+(Threshold Voltage Vth of Transistor M509) so that the transistor M509 is held in an ON state. Therefore, in order to make the voltage of the drain of the transistor M510 and the voltage of the node N10 high, it is effective to, by making the gate terminal voltage of the transistor M508 sufficiently high, cause the transistor M508 to operate in such a linear region that the drain/source terminal voltage is considerably small, and it is preferable to apply the power supply voltage VDD to the gate terminal of the transistor M508.

Further, the power supply voltage VSS may be applied to the gate terminal of the transistor M508. This places the transistor M508 in an OFF state, so that a leak current in the subthreshold region flows. This places the transistors M509 and M510 in an OFF state, too, to make a balance between the drain/source terminal voltages of the transistors M509 and M510 so that equal leak currents flow in the subthreshold regions. The voltage of the node N10 is a voltage obtained by dividing V10–V20 by the transistors M508, M509, and M510 in an OFF state.

Further, as shown in (b) of FIG. 12, the transistor M508 may have its gate terminal connected to the node N10 instead of being connected to the drain terminal of the transistor M508. In this case, Gate Potential VG=Source Potential VS in the transistor M508; therefore, the transistor M508 functions as a resistor that is determined by the gate-source voltage Vgs=0 V.

Further, the transistor M508 may be made to have its gate terminal supplied with a voltage having an overdrive voltage smaller than the power supply voltage VDD, so as to be given a desired ON resistance. This causes the transistor M508 to operate in the middle of the linear region, thus making it possible to easily select a given value of resistance and to easily pass the same drain current as the transistors M509 and M510 having a drain/source terminal voltage serving as a pinch-off voltage.

Further, the transistor M508 may be made to have its gate terminal connected to the node N10. This allows the transistor N508 to operate in a saturation region.

It should be noted that the transistors, M50, M508, M509, and M510 may be constituted by p-channel field-effect transistors. The TFTs can be formed by polysilicon (including low-temperature polysilicon), CG silicon, IGZO (In—Ga—Zn—O), or the like, as well as amorphous silicon.

Further, in a case where the transistor M50 used is a TFT having a comparatively large leak current, the current control of the transistor M50 by the circuit block 50a in the subthreshold region may be carried out by using leak current characteristics.

Example 7

As example of a circuit block 50 may be configured, instead of providing a circuit block 50a in FIGS. 7 to 12, such that the power supply voltage VDD, the power supply voltage VSS, or a voltage, smaller in overdrive voltage than in the case of application of the power supply voltage VDD, which gives a desired ON resistance to the transistor M50 is applied directly to the gate terminal of the transistor M50.

Embodiment 2

Figure 13:
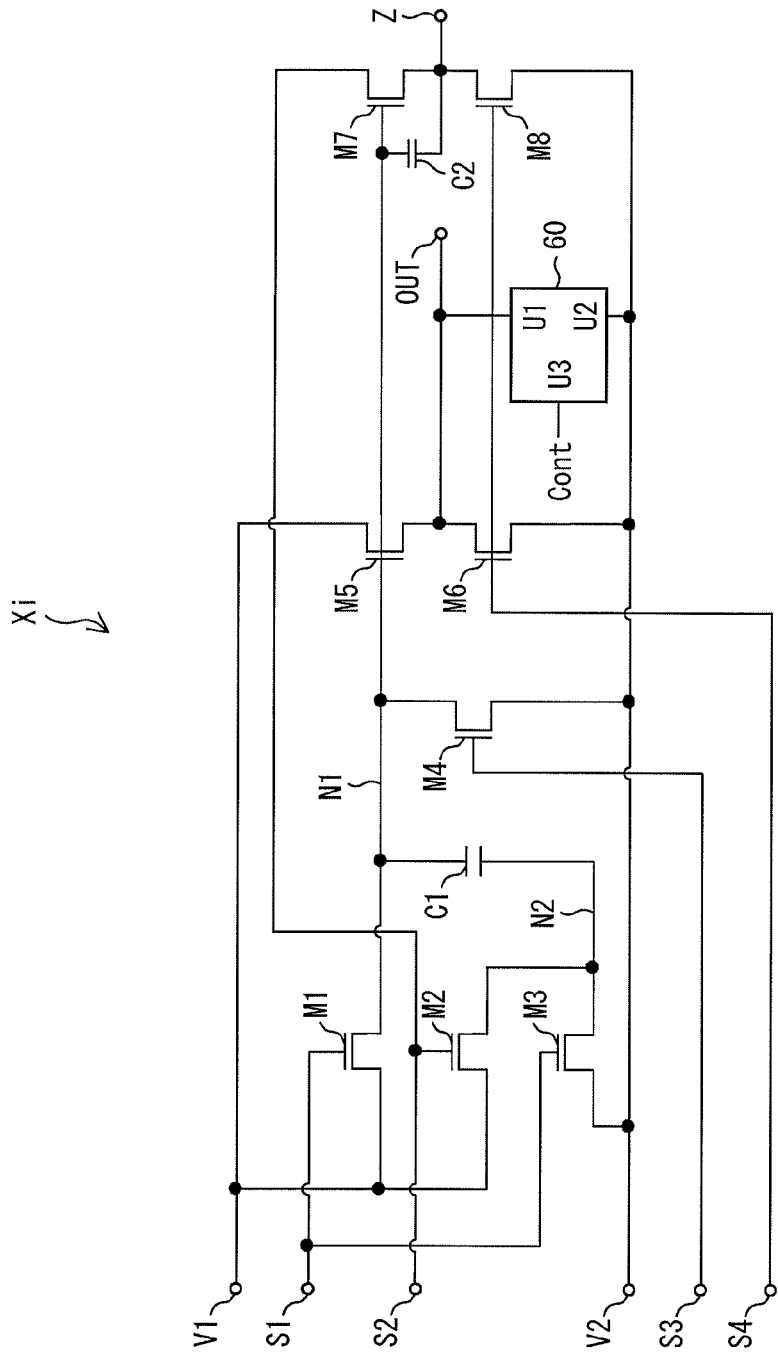
FIG. 13, showing an embodiment of the present invention, is a circuit diagram showing a configuration of a stage provided in a shift register according a second embodiment.

FIG. 13 shows a configuration of each stage Xi in an example.

The stage Xi is configured by replacing the circuit block 50 with a circuit block 60 in the stage Xi of FIG. 1.

As shown in FIG. 13, the circuit block (first circuit) 60, connected between an output terminal OUT and a terminal V2, has a terminal U1 connected to the output terminal OUT, a terminal U2 connected to the terminal V2, and a terminal (control terminal) U3 via which to receive a control signal Cont. The circuit block 60 includes an element whose conduction and disconnection is controlled by the control signal Cont received via the terminal U3. When the element is controlled by the control signal Cont to become conductive, the output terminal OUT and the terminal V2 become conductive with each other via the element, so that the circuit block 60 comes into an active state. On the other hand, when the element is controlled by the control signal Cont to be disconnected, the circuit block 60 comes into a nonactive state.

If the potential of the output terminal OUT is higher than the potential of the terminal V2 when a control signal Cont that places the circuit block 60 in an active state has been received, a sink current path though which an electric current including an electric current through the element flows from the output terminal OUT to the terminal V2 so that the potential of the output terminal OUT comes closer to the potential VSS of the terminal V2 is formed between the terminal U1 and the terminal U2.

A configuration of the circuit block 60 is described in detail by taking each of the examples below.

Example 8

Figure 14:
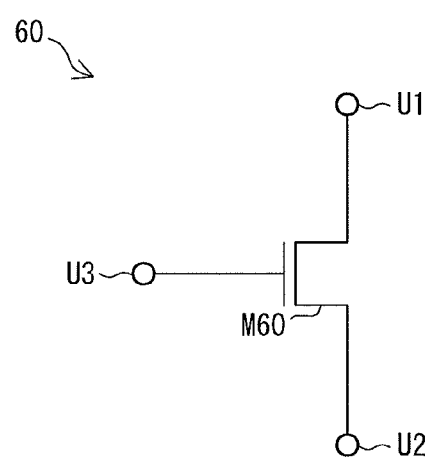
FIG. 14, showing an embodiment of the present invention, is a circuit diagram showing a configuration of a first circuit of a first example of the second embodiment.

FIG. 14 shows a configuration of an example of a circuit block 60.

The circuit block 60 of FIG. 14 includes a transistor M60.

The transistor (eleventh transistor) M60 is constituted by a field-effect transistor such as a TFT. In FIG. 14, the transistor M60 is an n-channel transistor. The transistor M60 has its drain connected to the terminal U1, its source terminal connected to the terminal U2, and its gate terminal connected the terminal U3.

Upon receipt via the terminal U3 of a control signal Cont that places the circuit block 60 in an active state, the transistor M60 comes into an ON state. Upon receipt via the terminal U3 of a control signal Cont that places the circuit block 60 in a nonactive state, the transistor M60 comes into an OFF state. If the potential of the output terminal OUT is higher than the potential of the terminal V2 when the circuit block 60 has come into an active state, an electric current flows from the terminal U1 to the terminal U2 via the transistor M60. Therefore, the circuit block 60 forms a sink current path.

A possible example of a control signal Cont is that one of the clock signals CLK1 and CLK2 of FIG. 4 which is different from the clock signal that is inputted to the stage Xi via the terminal S2. In this case, in that part of the period T1 of FIG. 5 during which the potential of the node N1 is boosted by the capacitor C1, the control signal Cont is at a Low level. Therefore, the circuit block 60 can be placed in a nonactive state. This makes it possible to prevent the potential of the output terminal OUT from lowering more than necessary.

It should be noted that the transistor M60 may be constituted by a p-channel field-effect transistor.

Example 9

Figure 15:
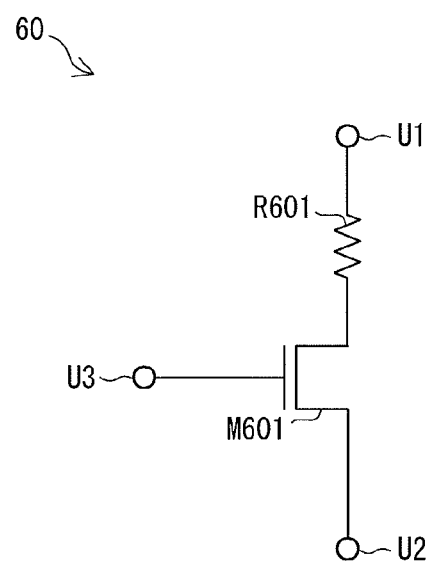
FIG. 15, showing an embodiment of the present invention, is a circuit diagram showing a configuration of a first circuit of a second example of the second embodiment.

FIG. 15 shows a configuration of an example of a circuit block 60.

The circuit block 60 of FIG. 15 includes a resistor R601 and a transistor M601.

The transistor (twelfth transistor) M601 is constituted by a field-effect transistor such as a TFT. In FIG. 15, the transistor M601 is an n-channel transistor. The resistor (sixth resistor) R601 is a resistance element having one end connected to the terminal U1, with the other end connected to the drain of the transistor M601. The transistor M601 has its source terminal connected to the terminal U2 and its gate terminal connected to the terminal U3. In the description of each of the examples, it is assumed that the drain means one drain/source terminal and the source terminal means the other drain/source terminal.

Upon receipt via the terminal U3 of a control signal Cont that places the circuit block 60 in an active state, the transistor M601 comes into an ON state. Upon receipt via the terminal U3 of a control signal Cont that places the circuit block 60 in a nonactive state, the transistor M601 comes into an OFF state. If the potential of the output terminal OUT is higher than the potential of the terminal V2 when the circuit block 60 has come into an active state, an electric current flows from the terminal U1 to the terminal U2 via a series-connected path formed by the resistor R601 and the transistor M601. Therefore, the circuit block 60 forms the series-connected path as a sink current path.

A possible example of a control signal Cont is that one of the clock signals CLK1 and CLK2 of FIG. 4 which is different from the clock signal that is inputted to the stage Xi via the terminal S2. In this case, in that part of the period T1 of FIG. 5 during which the potential of the node N1 is boosted by the capacitor C1, the control signal Cont is at a Low level. Therefore, the circuit block 60 can be placed in a nonactive state. This makes it possible to prevent the potential of the output terminal OUT from lowering more than necessary.

Alternatively, the resistor R601 may be constituted by a field-effect transistor such as a TFT that operates in a linear region.

Alternatively, unlike in FIG. 15, the circuit block 60 may be configured to include a parallel circuit formed by a resistor (sixth resistor) R601 and a transistor (twelfth transistor) M601. Although not illustrated, the resistor R601 has one end connected to the terminal U1 and the other end connected to the terminal U2. The transistor M601 has its drain connected to the terminal U1 and its source terminal connected to the terminal U2. The transistor M601 receives a control signal Cont via its gate terminal. In this case, the circuit block 60 comes into an active state when the control signal Cont received is a control signal Cont that places the transistor M601 in an ON state. In a nonactive state, if the potential of the output terminal OUT is higher than the potential of the terminal V2, an electric current flows through the resistor R601, but the output terminal OUT and the terminal V2 do not become conductive with each other via the transistor M601.

The resistor R601 can be formed by a metal layer forming wires of the display panel 12 and electrodes such as the source terminals/drains and gates terminal of the TFTs.

Alternatively, the resistor R601 can be formed by a semiconductor layer forming the TFTs.

Alternatively, the resistor R601 can be formed by a transparent electrode material for the picture elements PIX.

It should be noted that the transistor M601 may be constituted by a p-channel field-effect transistor. The TFTs can be formed by polysilicon (including low-temperature polysilicon), CG silicon, IGZO (In—Ga—Zn—O), or the like, as well as amorphous silicon.

Example 10

FIG. 16 shows a configuration of an example of a circuit block 60.

The circuit block 60 of FIG. 16 includes a transistor M60 and a circuit block 60*a*. The circuit block 60*a* includes a resistor R602 and a transistor M602.

The transistor (eleventh transistor) M60 is constituted by a field-effect transistor such as a TFT. In FIG. 16, the transistor M60 is an n-channel transistor, and has its drain connected to the terminal U1 and its source terminal connected to the terminal U2.

The circuit block 60*a* is a circuit that defines the conductance of the transistor M60, and includes a node N10 connected to the gate terminal of the transistor M60. The resistor (seventh resistor) R602 is a resistance element having one end connected to the node N10 and the other end to which a direct-current voltage (first voltage) V10 is applied. The transistor (thirteenth transistor) 602 has its drain connected to the node N10, with a direct-current voltage (second voltage) V20 being applied to the source terminal of the transistor M602. It is assumed here that V10>V20. Further, the transistor M602 has its gate terminal connected to the terminal U3.

Upon receipt via the terminal U3 of a control signal Cont that places the circuit block 60 in an active state, the transistor M602 comes into an OFF state. With this, there occurs a drop in voltage in the resistor 602 due to the flow of an electric current defined by a series-connected circuit formed by the resistor 602 and the OFF resistor of the transistor M602, so that the voltage of the node N10 is a High-level voltage obtained by subtracting the drop in voltage from the voltage V1. This voltage of the node N10 is applied to the gate terminal of the transistor M60, so that the transistor M60 comes into an ON state. If the potential of the output terminal OUT is higher than the potential of the terminal V2 at this point in time, a sink current path is formed through which an electric current flows from the terminal U1 to the terminal U2.

Upon receipt via the terminal U3 of a control signal Cont that places the circuit block 60 in a nonactive state, the transistor M602 comes into an ON state. With this, there occurs a drop in voltage in the resistor 602 due to the flow of an electric current defined by a series-connected circuit formed by the resistor 602 and the ON resistor of the transistor M602, so that the voltage of the node N10 is a Low-level voltage obtained by subtracting the drop in voltage from the voltage V1. This voltage of the node N10 is applied to the gate terminal of the transistor M60, so that the transistor M60 comes into an OFF state.

Because, in an active state, the transistor M50 operates in a linear region in a range where the potential difference between the terminal U1 and the terminal U2 is small, the transistor M60 functions as an element having a substantially constant value of resistance. Even if an increase in potential of the terminal U1 in an active state in the period T1 causes the transistor M60 to operate in a saturation region (constant-current region), the sink current can be held small by setting the node N10 at a low voltage in advance.

The resistor R602 can be formed by a metal layer forming wires of the display panel 12 and electrodes such as the source terminals/drains and gates terminal of the TFTs.

Alternatively, the resistor R602 can be formed by a semiconductor layer forming the TFTs.

Alternatively, the resistor R602 can be formed by a transparent electrode material for the picture elements PIX.

Further, the resistor R602 can be constituted by a field-effect transistor such as a TFT.

It should be noted that the transistors M60 and M602 may be constituted by p-channel field-effect transistors. In a case where the transistor M602 used is a p-channel transistor, the transistor M602 is placed on the side of the voltage V10 and the resistor R602 is placed on the side of the voltage V20.

Example 11

FIG. 17 shows a configuration of an example of a circuit block 60.

The circuit block 60 of FIG. 17 is obtained by configuring the circuit block 60 of FIG. 16 such that the circuit block 60a includes a resistor R603 and transistors M603 and M604.

The resistor (eighth resistor) R603 is a resistance element having one end connected to the node N10 and the other end to which the voltage V10 is applied. The transistors M603 and M604 are n-channel transistors. The transistor (fourteenth transistor) M603 has its drain connected to the node N10 and its source terminal connected to the gate terminal and drain of the transistor M604. The transistor (fifteenth transistor) M603 has its gate terminal connected to the terminal U3, with the voltage V20 being applied to the source terminal of the transistor M604. Therefore, the transistors M604 is diode-connected.

In the foregoing configuration, upon receipt via the terminal U3 of a control signal Cont that places the circuit block 60 in an active state, the transistor M603 comes into an OFF state. With this, the transistor M604 also comes into an OFF state. Therefore, an electric current defined by a series-connected circuit formed by the resistor R603, the OFF resistor of the transistor M603, and the OFF resistor of the transistor M604 flows thorough the resistor R603. The voltage of the node N10 becomes a voltage obtained by subtracting a drop in voltage in the resistor R603 from the voltage V10. This voltage of the node N10 is applied to the gate terminal of the transistor M60, so that the transistor M60 comes into an ON state. If the potential of the output terminal OUT is higher than the potential of the terminal V2 at this point in time, a sink current path is formed through which an electric current flows from the terminal U1 to the terminal U2.

The resistor R603 can be formed by a metal layer forming wires of the display panel 12 and electrodes such as the source terminals/drains and gates terminal of the TFTs.

Alternatively, the resistor R603 can be formed by a semiconductor layer forming the TFTs.

Alternatively, the resistor R603 can be formed by a transparent electrode material for the picture elements PIX.

Further, the resistor R603 can be constituted by a field-effect transistor such as a TFT.

It should be noted that the transistors M60, M603, and M604 may be constituted by p-channel field-effect transistors. In a case where the transistors M603 and M604 used are p-channel transistors, the transistors M603 and M604 are placed on the side of the voltage V10 and the resistor R603 is placed on the side of the voltage V20.

Embodiment 3

Figure 18:
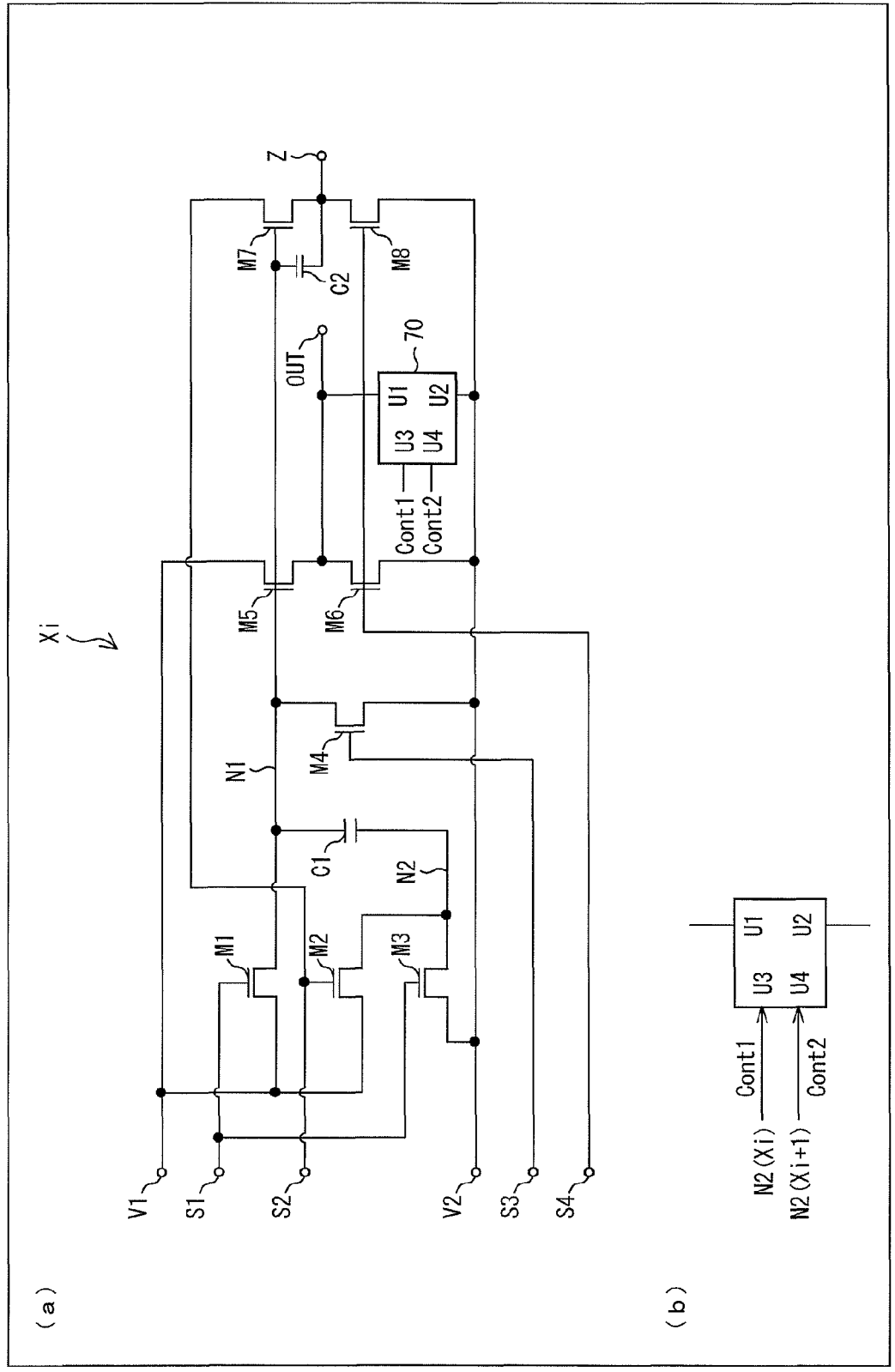
FIG. 18, showing an embodiment of the present invention, is a set of diagrams (a) and (b) each showing a configuration of a stage provided in a shift register according to a third embodiment, (a) being a circuit diagram showing the configuration of the stage, (b) being a circuit block diagram showing examples of control signals of a first circuit.

(a) of FIG. 18 shows a configuration of each stage Xi according to an embodiment.

The stage Xi is configured by replacing the circuit block 50 with a circuit block 70 in the stage Xi of FIG. 1.

The circuit block (first circuit) 70, connected between an output terminal OUT and a terminal V2, has a terminal U1 connected to the output terminal OUT, a terminal U2 connected to the terminal V2, a terminal (control terminal) U3 via which to receive a control signal Cont1, and a terminal (control terminal) U4 via which to receive a control signal Cont2. Thus, the circuit block 70 of the present embodiment is configured to receive a plurality of (two or more) control signals.

FIG. 19 is a configuration of an example of a circuit block 70.

The circuit block 70 of FIG. 19 includes transistors M701 and M702.

The transistors M701 and M702 are constituted by field-effect transistors such as TFTs. In FIG. 19, the transistors M701 and M702 are n-channel transistors. The transistor (sixteenth transistor) M701 has its drain connected to the terminal U1 and its source terminal connected to the drain of the transistor (sixteenth transistor) M702. The transistor M702 has its source terminal connected to the terminal U2. The transistor M701 has its gate terminal connected to the terminal U3, and the transistor M702 has its gate terminal connected to the terminal U4. Thus, the transistor M701 is an element whose conduction and disconnected are controlled by the control signal Cont1, and the transistor M702 is an element whose conduction and disconnected are controlled by the control signal Cont2. It is assumed that the drain means one drain/source terminal and the source terminal means the other drain/source terminal.

The number of sixteenth transistors is not limited to two. There may be provided any number of sixteenth transistors disposed in series with each other. Since sixteenth transistors need only be disposed in series with each other, another element may be serially inserted between one sixteenth transistor and another.

Let it be assumed here that the circuit block 70 takes on a first active state or a first nonactive state depending on the control signal Cont1 and takes on a second active state or a second nonactive state depending on the control signal Cont2. The first active state means that the transistor M701 is in an ON state, and the first nonactive state means that the transistor M701 is in an OFF state. The second active state means that the transistor M702 is in an ON state, and the second nonactive state means that the transistor M702 is in an OFF state.

Moreover, let it assumed that the circuit block 70 comes into an active state when the first active state and the second active state occur simultaneously, and is in a nonactive state otherwise.

Upon receipt via the terminal U3 of a control signal Cont1 that places the circuit block 70 in the first active state and receipt via the terminal U4 of a control signal Cont2 that places the circuit block 70 in the second active state, the transistors M701 and M702 both come into an ON state, so that the circuit block 70 comes into an active state. When control signals Cont 1 and Cont2 are inputted so that at least either the transistor M701 or the transistor M702 comes into an OFF state, the circuit block 70 comes into a nonactive state.

If the potential of the output terminal OUT is higher than the potential of the terminal V2 when the circuit block 70 has come into an active state, an electric current flows from the terminal U1 to the terminal U2 via a series-connected path formed by the transistor M701 and the transistor M702. Therefore, the circuit block 70 forms the series-connected path as a sink current path.

Possible examples of control signals Cont1 and Cont2 are signals identical in phase to that one of the clock signals CLK1 and CLK2 of FIG. 4 which is different from the clock signal that is inputted to the stage Xi via the terminal S2. The respective levels of the control signals Cont1 and Cont2 need only be independently set. In this case, in that part of the period T1 of FIG. 5 during which the potential of the node N1 is boosted by the capacitor C1, the control signals Cont1 and Cont2 are at a Low level. Therefore, the circuit block 70 can be placed in a nonactive state. This makes it possible to prevent the potential of the output terminal OUT from lowering more than necessary.

Further, as shown in (b) of FIG. 18, the voltage of the node N2 of the current state Xi and the voltage of the node N2 of the next state Xi+1 may be inputted as the control signal Cont1 and the control signal Cont2, respectively. In a case where the current output terminal OUTi is at a High level, the sink current path becomes OFF. In other case, the sink current path becomes ON, so that a rise in potential of the output terminal OUTi can be prevented.

Such a configuration of transistors connected in series makes it possible to control the first circuit in accordance with AND logic of a plurality of control signals.

Alternatively, unlike in FIG. 19, the circuit block 70 may be configured to include a parallel circuit formed by a transistor (sixteenth resistor) M701 and a transistor (sixteenth transistor) M702. Although not illustrated, the transistors M701 and M702 have their respective drains connected to the terminal U1 and their respective source terminals connected to the terminal U2. The transistor M701 receives a control signal Cont1 via its gate terminal, and the transistor M702 receives a control signal Cont2 via its gate terminal.

In this case, it is assumed that the circuit block 70 comes into an active state upon at least either receipt via the terminal U3 a control signal Cont1 that places the circuit block 70 in the first active state in which the transistor M701 is in an ON state or receipt via the terminal U4 a control signal Cont2 that places the circuit block 70 in the second active state in which the transistor M702 is in an ON state.

Therefore, the circuit block 70 comes into a nonactive state upon receipt via the terminal U3 a control signal Cont1 that places the circuit block 70 in the first nonactive state in which the transistor M701 is in an OFF state and receipt via the terminal U4 a control signal Cont2 that places the circuit block 70 in the first nonactive state in which the transistor M702 is in an OFF state.

In an active state of the circuit block 70, if the potential of the output terminal OUT is higher than the potential of the terminal V2, an ON current flows through at least either the transistor M701 or the transistor M702, so that the output terminal OUT and the terminal V2 become conductive with each other via the sixteenth transistors. Instead of being connected in parallel with each other, the sixteenth transistors need only be respectively provided in paths disposed in parallel between the output terminal OUT and the terminal V2.

Such a configuration of transistors connected in parallel makes it possible to control the first circuit in accordance with OR logic of a plurality of control signals.

It should be noted that the transistors M701 and M702 may be constituted by p-channel field-effect transistors. The TFTs can be formed by polysilicon (including low-temperature polysilicon), CG silicon, IGZO (In—Ga—Zn—O), or the like, as well as amorphous silicon.

Each of the embodiments has been described above.

It should be noted that the TFT 21 of each of the picture elements PIX is a p-channel transistor, the picture elements PIX are selected in a period during which the scanning signal is at a Low level. In this case, a stage Xi is configured which retains the output terminal OUT and the gate line GL at a High level in a non-selection period of the picture elements PIX. Therefore, the current path of the first circuit is a source current path through which an electric current flows from the second input terminal to the first output terminal.

Accordingly, there exist both a case where the potentials of the output terminal OUT and the gate line GL take on a High level and a case where the potentials of the output terminal OUT and the gate line GL take on a Low level. Therefore, the first circuit is a circuit, connected between the first output terminal and the second input terminal, which forms a current path between the first output terminal and the second input terminal.

As mentioned above, in order to solve the foregoing problems, a shift register of the present invention is a shift register including a cascade arrangement of stages for transmitting a shift pulse, each of the stages including: a shift pulse input terminal via which the shift pulse is inputted; an output terminal via which a signal is outputted from the stage, the stage including, as one output terminal, a shift pulse output terminal via which the shift pulse is outputted; a first input terminal to which a first direct-current voltage is applied; a second input terminal to which a second direct-current voltage is applied, the second direct-current voltage being different from the first direct-current voltage; a third input terminal via which a first clock signal is inputted to each of the stages, the first clock signal having its clock pulse active in a period that is out of overlap with a period of the shift pulse that is inputted via the shift pulse input terminal, a fourth input terminal via which a signal indicating connection and disconnection between a first predetermined point and the second input terminal is inputted; a fifth input terminal via which a signal indicating connection and disconnection between a second predetermined point and the second input terminal is inputted; a first output transistor having one drain/source terminal connected to the first input terminal, with the other drain/source terminal serving as a first output terminal constituting one output terminal that serves also as the shift pulse output terminal or one output terminal that is different from the shift pulse output terminal, the one output terminal being included in those output terminals via which signals are outputted from the stage; a first capacitor having one end connected to a gate terminal of the first output transistor; an input gate, connected to the shift pulse input terminal, which becomes conductive in accordance with a conduction control signal to allow passage of a potential during the period of the shift pulse so that the potential is supplied to the one end of the first capacitor during the period of the shift pulse, the conduction control signal being the shift pulse that is inputted via the shift pulse input terminal; a first switching element having one end connected to the other end of the first capacitor, the other end connected to the first input terminal, and a conduction and disconnection control terminal connected to the third input terminal; a second switching element having one end connected to the other end of the first capacitor, the other end connected to the second input terminal, and a conduction and disconnection control terminal connected to the shift pulse input terminal; a third switching element having one end connected to the one end of the first capacitor, the other end connected to the second input terminal, and a conduction and disconnection control terminal connected to the fourth input terminal, the one end of the first capacitor serving as the first predetermined point; a fourth switching element having one end connected to the first output terminal, the other end connected to the second input terminal, and a conduction and disconnection control terminal connected to the fifth input terminal, the first output terminal serving as the second predetermined point; and a first circuit, connected between the first output terminal and the second input terminal, which forms a current path between the first output terminal and the second input terminal.

According to the foregoing embodiment, the occurrence of a feed-through phenomenon through the drain parasitic capacitance and source terminal parasitic capacitance of the first output transistor can be avoided by applying the first direct-current voltage to the drain of the first output transistor and carrying out a switched capacitor operation using the first switching element, the second switching element, and the first capacitor. This makes it possible to prevent a fluctuation in output voltage that occurs in a case where the first output transistor receives a clock signal via its drain and a leakage of electric charges from picture element electrodes that occurs due to the fluctuation in output voltage, thus eliminating the need for an additional circuit for frequently connecting the first output terminal of the stage to a Low power supply.

This brings about an effect of making it possible to achieve a shift register capable of satisfactorily reducing noise in output from each stage without increasing circuit size.

Further, the provision of the first circuit causes a current path to be formed between the first output terminal and the second input terminal. This current path is formed so that while a reduction in voltage during output via the first output terminal is suppressed, the voltage is prevented from becoming higher than a potential that is supplied via the second input terminal when there is no output. This brings about an effect of making it possible to appropriately suppress a rise in potential of the first output terminal in a period during which there is no output to the first output terminal.

Further, the application of the direct-current voltage to the drain of the first output transistor makes it possible to drive the gate bus line by a direct-current power supply, thus bringing about an effect of making it possible to significantly reduce the load on an external level shifter that generates a control signal for the shift register, as compared to a case where the gate bus line is driven with a clock signal by inputting the clock signal to the first output transistor via its drain.

Further, the application of the direct-current voltage to the drain of the first output transistor lengthens the duration of application of negative bias between the gate terminal and drain of the first output transistor, thus making it possible to reduce a rise in threshold voltage. This brings about an effect of making it possible to suppress deterioration in performance of the shift register.

In order to solve the foregoing problems, the shift register of the present invention is configured such that the first circuit is constituted by a first resistor composed of a resistance element having one end connected to the first output terminal and the other end connected to the second input terminal.

The foregoing invention brings about an effect of making it possible to easily achieve the first circuit.

In order to solve the foregoing problems, the shift register of the present invention is configured such that: the first circuit includes a first transistor, a second resistor, and a third resistor; the first transistor is a field-effect transistor, the first transistor having one drain/source terminal connected to the first output terminal and the other drain/source terminal connected to the second input terminal; the second resistor is a resistance element having one end connected to a gate terminal of the first transistor and the other end to which a first voltage is applied; and the third resistor is a resistance element having one end connected to the gate terminal of the first transistor and the other end to which a second voltage is applied.

The foregoing invention brings about an effect of making it possible to easily achieve the first circuit.

In order to solve the foregoing problems, the shift register of the present invention is configured such that: the first circuit includes a first transistor, a second transistor, and a third transistor; the first transistor is a field-effect transistor, the first transistor having one drain/source terminal connected to the first output terminal and the other drain/source terminal connected to the second input terminal; the second transistor is a field-effect transistor, the second transistor having one drain/source terminal to which a first voltage is applied, the other drain/source terminal connected to a gate terminal of the first transistor, and a gate terminal to which a bias voltage is applied; and the third transistor is a field-effect transistor, the third transistor having one drain/source terminal connected to the gate terminal of the first transistor, the other drain/source terminal to which a second voltage is applied, and a gate terminal to which a bias voltage is applied.

The foregoing invention brings about an effect of making it possible to easily achieve the first circuit.

In order to solve the foregoing problems, the shift register of the present invention is configured such that: the first circuit includes a first transistor, a fourth resistor, and a fourth transistor; the first transistor is a field-effect transistor, the first transistor having one drain/source terminal connected to the first output terminal and the other drain/source terminal connected to the second input terminal; the fourth resistor is a resistance element having one end connected to a gate terminal of the first transistor and the other end to which a first voltage is applied; and the fourth transistor is a field-effect transistor, the fourth transistor having a gate terminal connected to one drain/source terminal of the fourth transistor, the one drain/source terminal connected to the gate terminal of the first transistor, and the other drain/source terminal to which a second voltage is applied.

The foregoing invention brings about an effect of making it possible to easily achieve the first circuit.

In order to solve the foregoing problems, the shift register of the present invention is configured such that: the first circuit includes a first transistor, a fifth transistor, and a sixth transistor; the first transistor is a field-effect transistor, the first transistor having one drain/source terminal connected to the first output terminal and the other drain/source terminal connected to the second input terminal; the fifth transistor is a field-effect transistor, the fifth transistor having one drain/source terminal to which a first voltage is applied, the other drain/source terminal connected to a gate terminal of the first transistor, and a gate terminal to which a bias voltage is applied; and the sixth transistor is a field-effect transistor, the sixth transistor having a gate terminal connected to one drain/source terminal of the sixth transistor, the one drain/source terminal connected to the gate terminal of the first transistor, and the other drain/source terminal to which a second voltage is applied.

The foregoing invention brings about an effect of making it possible to easily achieve the first circuit.

In order to solve the foregoing problems, the shift register of the present invention is configured such that the fifth transistor has its gate terminal connected to the drain/source terminal of the fifth transistor to which the first voltage is applied.

The foregoing invention brings about an effect of making it possible to easily apply a bias voltage to the fifth transistor.

In order to solve the foregoing problems, the shift register of the present invention is configured such that to the gate terminal of the fifth transistor, that one of the first and second direct-current voltages which makes the fifth transistor larger in conductance than the other one does is applied.

The foregoing invention brings about an effect of making it possible to easily apply a bias voltage for placing the fifth transistor in an ON state.

In order to solve the foregoing problems, the shift register of the present invention is configured such that to the gate terminal of the fifth transistor, that one of the first and second direct-current voltages which makes the fifth transistor smaller in conductance than the other one does is applied.

The foregoing invention brings about an effect of making it possible to easily apply a bias voltage for placing the fifth transistor in an OFF state.

In order to solve the foregoing problems, the shift register of the present invention is configured such that to the gate terminal of the fifth transistor, a voltage is applied which has an overdrive voltage smaller than in a case where that one of the first and second direct-current voltages which makes the fifth transistor larger in conductance than the other one does is applied to the gate terminal of the fifth transistor.

The foregoing invention brings about an effect of making it possible to easily apply a bias voltage for placing the fifth transistor in an ON state at a desired value of resistance.

In order to solve the foregoing problems, the shift register of the present invention is configured such that the fifth transistor has its gate terminal connected to the gate terminal of the first transistor.

The foregoing invention brings about an effect of making it possible to easily apply a bias voltage to the fifth transistor.

In order to solve the foregoing problems, the shift register of the present invention is configured such that: the first circuit includes a first transistor, a fifth resistor, a seventh transistor, and an eighth transistor; the first transistor is a field-effect transistor, the first transistor having one drain/source terminal connected to the first output terminal and the other drain/source terminal connected to the second input terminal; the fifth resistor is a resistance element having one end connected to a gate terminal of the first transistor and the other end to which a first voltage is applied; the seventh transistor is a field-effect transistor, the seventh transistor having a gate terminal connected to one drain/source terminal of the seventh transistor and the one drain/source terminal connected to the gate terminal of the first transistor; and the eighth transistor is a field-effect transistor, the eighth transistor having a gate terminal connected to one drain/source terminal of the eighth transistor, the one drain/source terminal connected to the other drain/source terminal of the seventh transistor, and the other drain/source terminal to which a second voltage is applied.

The foregoing invention brings about an effect of making it possible to easily achieve the first circuit.

In order to solve the foregoing problems, the shift register of the present invention is configured such that: the first circuit includes a first transistor, a ninth transistor, a tenth transistor, and an eleventh transistor; the first transistor is a field-effect transistor, the first transistor having one drain/source terminal connected to the first output terminal and the other drain/source terminal connected to the second input terminal; the ninth transistor is a field-effect transistor, the ninth transistor having one drain/source terminal connected to a gate terminal of the first transistor, the other drain/source terminal to which a first voltage is applied, and a gate terminal to which a bias voltage is applied; the tenth transistor is a field-effect transistor, the tenth transistor having a gate terminal connected to one drain/source terminal of the tenth transistor and the one drain/source terminal connected to the gate terminal of the first transistor; and the eleventh transistor is a field-effect transistor, the eleventh transistor having one drain/source terminal connected to the other drain/source terminal of the tenth transistor and the other drain/source terminal to which a second voltage is applied.

The foregoing invention brings about an effect of making it possible to easily achieve the first circuit.

In order to solve the foregoing problems, the shift register of the present invention is configured such that the ninth transistor has its gate terminal connected to the one drain/source terminal of the ninth transistor.

The foregoing invention brings about an effect of making it possible to easily apply a bias voltage to the ninth transistor.

In order to solve the foregoing problems, the shift register of the present invention is configured such that to the gate terminal of the ninth transistor, that one of the first and second direct-current voltages which makes the ninth transistor larger in conductance than the other one does is applied.

The foregoing invention brings about an effect of making it possible to easily apply a bias voltage for placing the ninth transistor in an ON state.

In order to solve the foregoing problems, the shift register of the present invention is configured such that to the gate terminal of the ninth transistor, that one of the first and second direct-current voltages which makes the ninth transistor smaller in conductance than the other one does is applied.

The foregoing invention brings about an effect of making it possible to easily apply a bias voltage for placing the ninth transistor in an OFF state.

In order to solve the foregoing problems, the shift register of the present invention is configured such that to the gate terminal of the ninth transistor, a voltage is applied which has an overdrive voltage smaller than in a case where that one of the first and second direct-current voltages which makes the ninth transistor larger in conductance than the other one does is applied to the gate terminal of the ninth transistor.

The foregoing invention brings about an effect of making it possible to easily apply a bias voltage for placing the ninth transistor in an ON state at a desired value of resistance.

In order to solve the foregoing problems, the shift register of the present invention is configured such that the ninth transistor has its gate terminal connected to the gate terminal of the first transistor.

The foregoing invention brings about an effect of making it possible to easily apply a bias voltage to the ninth transistor.

In order to solve the foregoing problems, a shift register of the present invention is a shift register including a cascade arrangement of stages for transmitting a shift pulse, each of the stages including: a shift pulse input terminal via which the shift pulse is inputted; an output terminal via which a signal is outputted from the stage, the stage including, as one output terminal, a shift pulse output terminal via which the shift pulse is outputted; a first input terminal to which a first direct-current voltage is applied; a second input terminal to which a second direct-current voltage is applied, the second direct-current voltage being different from the first direct-current voltage; a third input terminal via which a first clock signal is inputted to each of the stages, the first clock signal having its clock pulse active in a period that is out of overlap with a period of the shift pulse that is inputted via the shift pulse input terminal, a fourth input terminal via which a signal indicating connection and disconnection between a first predetermined point and the second input terminal is inputted; a fifth input terminal via which a signal indicating connection and disconnection between a second predetermined point and the second input terminal is inputted; a first output transistor having one drain/source terminal connected to the first input terminal, with the other drain/source terminal serving as a first output terminal constituting one output terminal that serves also as the shift pulse output terminal or one output terminal that is different from the shift pulse output terminal, the one output terminal being included in those output terminals via which signals are outputted from the stage; a first capacitor having one end connected to a gate terminal of the first output transistor; an input gate, connected to the shift pulse input terminal, which becomes conductive in accordance with a conduction control signal to allow passage of a potential during the period of the shift pulse so that the potential is supplied to the one end of the first capacitor during the period of the shift pulse, the conduction control signal being the shift pulse that is inputted via the shift pulse input terminal; a first switching element having one end connected to the other end of the first capacitor, the other end connected to the first input terminal, and a conduction and disconnection control terminal connected to the third input terminal; a second switching element having one end connected to the other end of the first capacitor, the other end connected to the second input terminal, and a conduction and disconnection control terminal connected to the shift pulse input terminal; a third switching element having one end connected to the one end of the first capacitor, the other end connected to the second input terminal, and a conduction and disconnection control terminal connected to the fourth input terminal, the one end of the first capacitor serving as the first predetermined point; a fourth switching element having one end connected to the first output terminal, the other end connected to the second input terminal, and a conduction and disconnection control terminal connected to the fifth input terminal, the first output terminal serving as the second predetermined point; and a first circuit, connected between the first output terminal and the second input terminal, which has a control terminal and which forms a current path between the first output terminal and the second input terminal.

According to the foregoing embodiment, the occurrence of a feed-through phenomenon through the drain parasitic capacitance and source terminal parasitic capacitance of the first output transistor can be avoided by applying the first direct-current voltage to the drain of the first output transistor and carrying out a switched capacitor operation using the first switching element, the second switching element, and the first capacitor. This makes it possible to prevent a fluctuation in output voltage that occurs in a case where the first output transistor receives a clock signal via its drain and a leakage of electric charges from liquid crystal picture element electrodes that occurs due to the fluctuation in output voltage, thus eliminating the need for an additional circuit for frequently connecting the first output terminal of the stage to a Low power supply.

This brings about an effect of making it possible to achieve a shift register capable of satisfactorily reducing noise in output from each stage without increasing circuit size.

Further, the provision of the first circuit causes a current path to be formed between the first output terminal and the second input terminal. This current path is formed so that while a reduction in voltage during output via the first output terminal is suppressed, the voltage is prevented from becoming higher than a potential that is supplied via the second input terminal when there is no output. This brings about an effect of making it possible to appropriately suppress a rise in potential of the first output terminal in a period during which there is no output to the first output terminal.

Further, the application of the direct-current voltage to the drain of the first output transistor makes it possible to drive the gate bus line by a direct-current power supply, thus bringing about an effect of making it possible to significantly reduce the load on an external level shifter that generates a control signal for the shift register, as compared to a case where the gate bus line is driven with a clock signal by inputting the clock signal to the first output transistor via its drain.

Further, the application of the direct-current voltage to the drain of the first output transistor lengthens the duration of application of negative bias between the gate terminal and drain of the first output transistor, thus making it possible to reduce a rise in threshold voltage. This brings about an effect of making it possible to suppress deterioration in performance of the shift register.

In order to solve the foregoing problems, the shift register of the present invention is configured such that: the first circuit include an eleventh transistor; and the eleventh transistor is a field-effect transistor, the eleventh transistor having one drain/source terminal connected to the first output terminal, the other drain/source terminal connected to the second input terminal, and a gate terminal connected to the control terminal of the first circuit.

The foregoing invention brings about an effect of making it possible to easily achieve the first circuit.

In order to solve the foregoing problems, the shift register of the present invention is configured such that: the first circuit includes a sixth resistor and a twelfth transistor; the sixth resistor is a resistance element having one end connected to the first output terminal and the other end connected to one drain/source terminal of the twelfth transistor; and the twelfth transistor is a field-effect transistor, the twelfth transistor having the other drain/source terminal connected to the second input terminal and a gate terminal connected to the control terminal of the first circuit.

The foregoing invention brings about an effect of making it possible to easily achieve the first circuit.

In order to solve the foregoing problems, the shift register of the present invention is configured such that: the first circuit includes a sixth resistor and a twelfth transistor; the sixth resistor is a resistance element having one end connected to the first output terminal and the other end connected to the second input terminal; and the twelfth transistor is a field-effect transistor, the twelfth transistor having one drain/source terminal connected to the first output terminal, the other drain/source terminal connected to the second input terminal, and a gate terminal connected to the control terminal of the first circuit.

The foregoing invention brings about an effect of making it possible to easily achieve the first circuit.

In order to solve the foregoing problems, the shift register of the present invention is configured such that: the first circuit includes a sixth resistor and a twelfth transistor; the sixth resistor is a resistance element having one end connected to one drain/source terminal of the twelfth transistor and the other end connected to the second input terminal; and the twelfth transistor is a field-effect transistor, the twelfth transistor having the other drain/source terminal connected to the first output terminal and a gate terminal connected to the control terminal of the first circuit.

The foregoing invention brings about an effect of making it possible to easily achieve the first circuit.

In order to solve the foregoing problems, the shift register of the present invention is configured such that: the first circuit includes an eleventh transistor, a seventh resistor, and a thirteenth transistor; the eleventh transistor is a field-effect transistor, the eleventh transistor having one drain/source terminal connected to the first output terminal and the other drain/source terminal connected to the second input terminal; the seventh resistor is a resistance element having one end to which a first voltage is applied and the other end connected to a gate terminal of the eleventh transistor; and the thirteenth transistor is a field-effect transistor, the thirteenth transistor having one drain/source terminal connected to the gate terminal of the eleventh transistor, the other drain/source terminal to which a second voltage is applied, and a gate terminal connected to the control terminal of the first circuit.

The foregoing invention brings about an effect of making it possible to easily achieve the first circuit.

In order to solve the foregoing problems, the shift register of the present invention is configured such that: the first circuit includes an eleventh transistor, an eighth resistor, a fourteenth transistor, and a fifteenth transistor; the eleventh transistor is a field-effect transistor, the eleventh transistor having one drain/source terminal connected to the first output terminal and the other drain/source terminal connected to the second input terminal; the eighth resistor is a resistance element having one end to which a first voltage is applied and the other end connected to a gate terminal of the eleventh transistor; the fourteenth transistor is a field-effect transistor, the fourteenth transistor having one drain/source terminal connected to the gate terminal of the eleventh transistor and the drain/source terminal connected to one drain/source terminal of the fifteenth transistor; the fifteenth transistor is a field-effect transistor, the fifteenth transistor having the other drain/source terminal to which a second voltage is applied; and either one of the fourteenth and fifteenth transistors has a gate terminal connected to the control terminal of the first circuit and the other one of the fourteenth and fifteenth transistors has a gate terminal connected to the one drain/source terminal of the other one of the fourteenth and fifteenth transistors.

The foregoing invention brings about an effect of making it possible to easily achieve the first circuit.

In order to solve the foregoing problems, the shift register of the present invention is configured such that: the sixteenth transistor of the first circuit comprises a plurality of sixteenth transistors arranged in series with each other between the first output terminal and the second input terminal; and the sixteenth transistors have gate terminals connected to each separate control terminal of the first circuit.

The foregoing invention brings about an effect of making it possible to easily achieve the first circuit, and also an effect of making it possible to control the first circuit in accordance with AND logic of a plurality of control signals.

In order to solve the foregoing problems, the shift register of the present invention is configured such that: the sixteenth transistor of the first circuit comprises a plurality of sixteenth transistors arranged in parallel with each other between the first output terminal and the second input terminal; and the sixteenth transistors have gate terminals connected to each separate control terminal of the first circuit.

The foregoing invention brings about an effect of making it possible to easily achieve the first circuit, and also an effect of making it possible to control the first circuit in accordance with OR logic of a plurality of control signals.

In order to solve the foregoing problems, a display device of the present invention includes such a shift register as those described above.

The foregoing invention brings about an effect of making it possible to achieve a display device with high display quality.

In order to solve the foregoing problems, the shift register of the present invention is configured such that the resistance element(s) is/are formed by a field-effect transistor(s)

The foregoing invention brings about an effect of making it possible to manufacture resistance elements together with other field-effect transistors through a field-effect transistor process.

In order to solve the foregoing problems, the shift register of the present invention is configured such that the resistance element(s) is/are formed by a metal layer forming wires of a display panel or electrodes of TFTs.

The foregoing invention brings about an effect of making it possible to manufacture resistance elements through a normal process for a display device.

In order to solve the foregoing problems, the shift register of the present invention is configured such that the resistance element(s) is/are formed by a semiconductor layer forming TFTs.

The foregoing invention brings about an effect of making it possible to manufacture resistance elements through a normal process for a display device.

In order to solve the foregoing problems, the shift register of the present invention is configured such that the resistance element(s) is/are formed by a transparent electrode material for picture elements.

The foregoing invention brings about an effect of making it possible to manufacture resistance elements through a normal process for a display device.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

The present invention can be suitably used for an active-matrix display device.

The invention claimed is:

1. A shift register including a cascade arrangement of stages for transmitting a shift pulse, each of the stages comprising:

a shift pulse input terminal via which the shift pulse is inputted;

a first input terminal to which a first direct-current voltage is applied;

a second input terminal to which a second direct-current voltage is applied;

a third input terminal via which a first clock signal is inputted to each of the stages, the first clock signal having its clock pulse active in a period that is out of overlap with a period of the shift pulse that is inputted via the shift pulse input terminal, a fourth input terminal via which a signal indicating connection and disconnection between a first predetermined point and the second input terminal is inputted;

a fifth input terminal via which a signal indicating connection and disconnection between a second predetermined point and the second input terminal is inputted;

a first capacitor having one end connected to a gate terminal of a first output transistor;

an input gate, connected to the shift pulse input terminal, which becomes conductive in accordance with a conduction control signal to allow passage of a potential during the period of the shift pulse so that the potential is supplied to the one end of the first capacitor, the conduction control signal being the shift pulse that is inputted via the shift pulse input terminal;

a first switching element having one end connected to the other end of the first capacitor, the other end connected to the first input terminal, and a conduction and disconnection control terminal connected to the third input terminal;

a second switching element having one end connected to the other end of the first capacitor, the other end connected to the second input terminal, and a conduction and disconnection control terminal connected to the shift pulse input terminal;

a third switching element having one end connected to the one end of the first capacitor, the other end connected to the second input terminal, and a conduction and disconnection control terminal connected to the fourth input terminal, the one end of the first capacitor serving as the first predetermined point;

a fourth switching element having one end connected to a first output terminal, the other end connected to the second input terminal, and a conduction and disconnection control terminal connected to the fifth input terminal, the first output terminal serving as the second predetermined point; and a first circuit, connected between the first output terminal and the second input terminal, which forms a current path between the first output terminal and the second input terminal, wherein:

either:

each of the stages further comprise a shift pulse output terminal via which the shift pulse is outputted from the stage, and the first output transistor having one drain/source terminal connected to the first input terminal, with the other drain/source terminal serving as the first output terminal via which a signal is outputted from the stage; or each of the stages further comprise the first output transistor having one drain/source terminal connected to the first input terminal, with the other drain/source terminal serving as the first output terminal via which the shift pulse is outputted from the stage;

the first circuit includes a first transistor, a second resistor, and a third resistor;

the first transistor is a field-effect transistor, the first transistor having one drain/source terminal connected to the first output terminal and the other drain/source terminal connected to the second input terminal;

the second resistor is a resistance element having one end connected to a gate terminal of the first transistor and the other end to which a first voltage is applied; and the third resistor is a resistance element having one end connected to the gate terminal of the first transistor and the other end to which a second voltage is applied.

2. A display device comprising a shift register as set forth in claim 1.

3. The shift register as set forth in claim 1, wherein the resistance element(s) is/are formed by a field-effect transistor(s).

4. The shift register as set forth in claim 1, wherein the resistance element(s) is/are formed by a metal layer forming wires of a display panel or electrodes of TFTs.

5. The shift register as set forth in claim 1, wherein the resistance element(s) is/are formed by a semiconductor layer forming TFTs.

6. The shift register as set forth in claim 1, wherein the resistance element(s) is/are formed by a transparent electrode material for picture elements.

7. The shift register as set forth in claim 1, wherein each of the stages further comprise the shift pulse output terminal via which the shift pulse is outputted from the stage, and the first output transistor having one drain/source terminal connected to the first input terminal, with the other drain/source terminal serving as the first output terminal via which the signal is outputted from the stage.

8. The shift register as set forth in claim 1, wherein each of the stages further comprise the first output transistor having one drain/source terminal connected to the first input terminal, with the other drain/source terminal serving as the first output terminal via which the shift pulse is outputted from the stage.

9. A shift register including a cascade arrangement of stages for transmitting a shift pulse, each of the stages comprising:

a shift pulse input terminal via which the shift pulse is inputted;

a first input terminal to which a first direct-current voltage is applied;

a second input terminal to which a second direct-current voltage is applied;

a third input terminal via which a first clock signal is inputted to each of the stages, the first clock signal having its clock pulse active in a period that is out of overlap with a period of the shift pulse that is inputted via the shift pulse input terminal, a fourth input terminal via which a signal indicating connection and disconnection between a first predetermined point and the second input terminal is inputted;

a fifth input terminal via which a signal indicating connection and disconnection between a second predetermined point and the second input terminal is inputted;

a first capacitor having one end connected to a gate terminal of a first output transistor;

an input gate, connected to the shift pulse input terminal, which becomes conductive in accordance with a conduction control signal to allow passage of a potential during the period of the shift pulse so that the potential is supplied to the one end of the first capacitor, the conduction control signal being the shift pulse that is inputted via the shift pulse input terminal;

a first switching element having one end connected to the other end of the first capacitor, the other end connected to the first input terminal, and a conduction and disconnection control terminal connected to the third input terminal;

a second switching element having one end connected to the other end of the first capacitor, the other end connected to the second input terminal, and a conduction and disconnection control terminal connected to the shift pulse input terminal;

a third switching element having one end connected to the one end of the first capacitor, the other end connected to the second input terminal, and a conduction and disconnection control terminal connected to the fourth input terminal, the one end of the first capacitor serving as the first predetermined point;

a fourth switching element having one end connected to a first output terminal, the other end connected to the second input terminal, and a conduction and disconnection control terminal connected to the fifth input terminal, the first output terminal serving as the second predetermined point; and a first circuit, connected between the first output terminal and the second input terminal, which forms a current path between the first output terminal and the second input terminal, wherein:

either:

each of the stages further comprise a shift pulse output terminal via which the shift pulse is outputted from the stage, and the first output transistor having one drain/source terminal connected to the first input terminal, with the other drain/source terminal serving as the first output terminal via which a signal is outputted from the stage; or each of the stages further comprise the first output transistor having one drain/source terminal connected to the first input terminal, with the other drain/source terminal serving as the first output terminal via which the shift pulse is outputted from the stage;

the first circuit includes a first transistor, a second transistor, and a third transistor;

the first transistor is a field-effect transistor, the first transistor having one drain/source terminal connected to the first output terminal and the other drain/source terminal connected to the second input terminal;

the second transistor is a field-effect transistor, the second transistor having one drain/source terminal to which a first voltage is applied, the other drain/source terminal connected to a gate terminal of the first transistor, and a gate terminal to which a bias voltage is applied; and the third transistor is a field-effect transistor, the third transistor having one drain/source terminal connected to the gate terminal of the first transistor, the other drain/source terminal to which a second voltage is applied, and a gate terminal to which a bias voltage is applied.

10. The shift register as set forth in claim 9, wherein each of the stages further comprise the shift pulse output terminal via which the shift pulse is outputted from the stage, and the first output transistor having one drain/source terminal connected to the first input terminal, with the other drain/source terminal serving as the first output terminal via which the signal is outputted from the stage.

11. The shift register as set forth in claim 9, wherein each of the stages further comprise the first output transistor having one drain/source terminal connected to the first input terminal, with the other drain/source terminal serving as the first output terminal via which the shift pulse is outputted from the stage.

12. A shift register including a cascade arrangement of stages for transmitting a shift pulse, each of the stages comprising:

a shift pulse input terminal via which the shift pulse is inputted;

a first input terminal to which a first direct-current voltage is applied;

a second input terminal to which a second direct-current voltage is applied;

a third input terminal via which a first clock signal is inputted to each of the stages, the first clock signal having its clock pulse active in a period that is out of overlap with a period of the shift pulse that is inputted via the shift pulse input terminal, a fourth input terminal via which a signal indicating connection and disconnection between a first predetermined point and the second input terminal is inputted;

a fifth input terminal via which a signal indicating connection and disconnection between a second predetermined point and the second input terminal is inputted;

a first capacitor having one end connected to a gate terminal of a first output transistor;

an input gate, connected to the shift pulse input terminal, which becomes conductive in accordance with a conduction control signal to allow passage of a potential during the period of the shift pulse so that the potential is supplied to the one end of the first capacitor, the conduction control signal being the shift pulse that is inputted via the shift pulse input terminal;

a first switching element having one end connected to the other end of the first capacitor, the other end connected to the first input terminal, and a conduction and disconnection control terminal connected to the third input terminal;

a second switching element having one end connected to the other end of the first capacitor, the other end connected to the second input terminal, and a conduction and disconnection control terminal connected to the shift pulse input terminal;

a third switching element having one end connected to the one end of the first capacitor, the other end connected to the second input terminal, and a conduction and disconnection control terminal connected to the fourth input terminal, the one end of the first capacitor serving as the first predetermined point;

a fourth switching element having one end connected to a first output terminal, the other end connected to the second input terminal, and a conduction and disconnection control terminal connected to the fifth input terminal, the first output terminal serving as the second predetermined point; and a first circuit, connected between the first output terminal and the second input terminal, which forms a current path between the first output terminal and the second input terminal, wherein:

either:

each of the stages further comprise a shift pulse output terminal via which the shift pulse is outputted from the stage, and the first output transistor having one drain/source terminal connected to the first input terminal, with the other drain/source terminal serving as the first output terminal via which a signal is outputted from the stage; or each of the stages further comprise the first output transistor having one drain/source terminal connected to the first input terminal, with the other drain/source terminal serving as the first output terminal via which the shift pulse is outputted from the stage;

the first circuit includes a first transistor, a fourth resistor, and a fourth transistor;

the first transistor is a field-effect transistor, the first transistor having one drain/source terminal connected to the first output terminal and the other drain/source terminal connected to the second input terminal;

the fourth resistor is a resistance element having one end connected to a gate terminal of the first transistor and the other end to which a first voltage is applied; and the fourth transistor is a field-effect transistor, the fourth transistor having a gate terminal connected to one drain/source terminal of the fourth transistor, the one drain/source terminal connected to the gate terminal of the first transistor, and the other drain/source terminal to which a second voltage is applied.

13. The shift register as set forth in claim 12, wherein each of the stages further comprise the shift pulse output terminal via which the shift pulse is outputted from the stage, and the first output transistor having one drain/source terminal connected to the first input terminal, with the other drain/source terminal serving as the first output terminal via which the signal is outputted from the stage.

14. The shift register as set forth in claim 12, wherein each of the stages further comprise the first output transistor having one drain/source terminal connected to the first input terminal, with the other drain/source terminal serving as the first output terminal via which the shift pulse is outputted from the stage.

15. A shift register including a cascade arrangement of stages for transmitting a shift pulse, each of the stages comprising:

a shift pulse input terminal via which the shift pulse is inputted;

a first input terminal to which a first direct-current voltage is applied;

a second input terminal to which a second direct-current voltage is applied;
a third input terminal via which a first clock signal is inputted to each of the stages, the first clock signal having its clock pulse active in a period that is out of overlap with a period of the shift pulse that is inputted via the shift pulse input terminal,
a fourth input terminal via which a signal indicating connection and disconnection between a first predetermined point and the second input terminal is inputted;
a fifth input terminal via which a signal indicating connection and disconnection between a second predetermined point and the second input terminal is inputted;
a first capacitor having one end connected to a gate terminal of a first output transistor;
an input gate, connected to the shift pulse input terminal, which becomes conductive in accordance with a conduction control signal to allow passage of a potential during the period of the shift pulse so that the potential is supplied to the one end of the first capacitor, the conduction control signal being the shift pulse that is inputted via the shift pulse input terminal;
a first switching element having one end connected to the other end of the first capacitor, the other end connected to the first input terminal, and a conduction and disconnection control terminal connected to the third input terminal;
a second switching element having one end connected to the other end of the first capacitor, the other end connected to the second input terminal, and a conduction and disconnection control terminal connected to the shift pulse input terminal;
a third switching element having one end connected to the one end of the first capacitor, the other end connected to the second input terminal, and a conduction and disconnection control terminal connected to the fourth input terminal, the one end of the first capacitor serving as the first predetermined point;
a fourth switching element having one end connected to a first output terminal, the other end connected to the second input terminal, and a conduction and disconnection control terminal connected to the fifth input terminal, the first output terminal serving as the second predetermined point; and
a first circuit, connected between the first output terminal and the second input terminal, which forms a current path between the first output terminal and the second input terminal, wherein:
either:
each of the stages further comprise a shift pulse output terminal via which the shift pulse is outputted from the stage, and the first output transistor having one drain/source terminal connected to the first input terminal, with the other drain/source terminal serving as the first output terminal via which a signal is outputted from the stage; or
each of the stages further comprise the first output transistor having one drain/source terminal connected to the first input terminal, with the other drain/source terminal serving as the first output terminal via which the shift pulse is outputted from the stage;
the first circuit includes a first transistor, a fifth transistor, and a sixth transistor;
the first transistor is a field-effect transistor, the first transistor having one drain/source terminal connected to the first output terminal and the other drain/source terminal connected to the second input terminal;
the fifth transistor is a field-effect transistor, the fifth transistor having one drain/source terminal to which a first voltage is applied, the other drain/source terminal connected to a gate terminal of the first transistor, and a gate terminal to which a bias voltage is applied; and
the sixth transistor is a field-effect transistor, the sixth transistor having a gate terminal connected to one drain/source terminal of the sixth transistor, the one drain/source terminal connected to the gate terminal of the first transistor, and the other drain/source terminal to which a second voltage is applied.

16. The shift register as set forth in claim 15, wherein the fifth transistor has its gate terminal connected to the drain/source terminal of the fifth transistor to which the first voltage is applied.

17. The shift register as set forth in claim 15, wherein to the gate terminal of the fifth transistor, that one of the first and second direct-current voltages which makes the fifth transistor larger in conductance than the other one does is applied.

18. The shift register as set forth in claim 15, wherein to the gate terminal of the fifth transistor, that one of the first and second direct-current voltages which makes the fifth transistor smaller in conductance than the other one does is applied.

19. The shift register as set forth in claim 15, wherein to the gate terminal of the fifth transistor, a voltage is applied which has an overdrive voltage smaller than in a case where that one of the first and second direct-current voltages which makes the fifth transistor larger in conductance than the other one does is applied to the gate terminal of the fifth transistor.

20. The shift register as set forth in claim 15, wherein the fifth transistor has its gate terminal connected to the gate terminal of the first transistor.

21. The shift register as set forth in claim 15, wherein each of the stages further comprise the shift pulse output terminal via which the shift pulse is outputted from the stage, and the first output transistor having one drain/source terminal connected to the first input terminal, with the other drain/source terminal serving as the first output terminal via which the signal is outputted from the stage.

22. The shift register as set forth in claim 15, wherein each of the stages further comprise the first output transistor having one drain/source terminal connected to the first input terminal, with the other drain/source terminal serving as the first output terminal via which the shift pulse is outputted from the stage.

23. A shift register including a cascade arrangement of stages for transmitting a shift pulse,
each of the stages comprising:
a shift pulse input terminal via which the shift pulse is inputted;
a first input terminal to which a first direct-current voltage is applied;
a second input terminal to which a second direct-current voltage is applied;
a third input terminal via which a first clock signal is inputted to each of the stages, the first clock signal having its clock pulse active in a period that is out of overlap with a period of the shift pulse that is inputted via the shift pulse input terminal,
a fourth input terminal via which a signal indicating connection and disconnection between a first predetermined point and the second input terminal is inputted;
a fifth input terminal via which a signal indicating connection and disconnection between a second predetermined point and the second input terminal is inputted;
a first capacitor having one end connected to a gate terminal of a first output transistor;

an input gate, connected to the shift pulse input terminal, which becomes conductive in accordance with a conduction control signal to allow passage of a potential during the period of the shift pulse so that the potential is supplied to the one end of the first capacitor, the conduction control signal being the shift pulse that is inputted via the shift pulse input terminal;

a first switching element having one end connected to the other end of the first capacitor, the other end connected to the first input terminal, and a conduction and disconnection control terminal connected to the third input terminal;

a second switching element having one end connected to the other end of the first capacitor, the other end connected to the second input terminal, and a conduction and disconnection control terminal connected to the shift pulse input terminal;

a third switching element having one end connected to the one end of the first capacitor, the other end connected to the second input terminal, and a conduction and disconnection control terminal connected to the fourth input terminal, the one end of the first capacitor serving as the first predetermined point;

a fourth switching element having one end connected to a first output terminal, the other end connected to the second input terminal, and a conduction and disconnection control terminal connected to the fifth input terminal, the first output terminal serving as the second predetermined point; and a first circuit, connected between the first output terminal and the second input terminal, which forms a current path between the first output terminal and the second input terminal, wherein:

either:
  each of the stages further comprise a shift pulse output terminal via which the shift pulse is outputted from the stage, and the first output transistor having one drain/source terminal connected to the first input terminal, with the other drain/source terminal serving as the first output terminal via which a signal is outputted from the stage; or
  each of the stages further comprise the first output transistor having one drain/source terminal connected to the first input terminal, with the other drain/source terminal serving as the first output terminal via which the shift pulse is outputted from the stage;

the first circuit includes a first transistor, a fifth resistor, a seventh transistor, and an eighth transistor;

the first transistor is a field-effect transistor, the first transistor having one drain/source terminal connected to the first output terminal and the other drain/source terminal connected to the second input terminal;

the fifth resistor is a resistance element having one end connected to a gate terminal of the first transistor and the other end to which a first voltage is applied;

the seventh transistor is a field-effect transistor, the seventh transistor having a gate terminal connected to one drain/source terminal of the seventh transistor and the one drain/source terminal connected to the gate terminal of the first transistor; and the eighth transistor is a field-effect transistor, the eighth transistor having a gate terminal connected to one drain/source terminal of the eighth transistor, the one drain/source terminal connected to the other drain/source terminal of the seventh transistor, and the other drain/source terminal to which a second voltage is applied.

24. The shift register as set forth in claim 23, wherein each of the stages further comprise the shift pulse output terminal via which the shift pulse is outputted from the stage, and the first output transistor having one drain/source terminal connected to the first input terminal, with the other drain/source terminal serving as the first output terminal via which the signal is outputted from the stage.

25. The shift register as set forth in claim 23, wherein each of the stages further comprise the first output transistor having one drain/source terminal connected to the first input terminal, with the other drain/source terminal serving as the first output terminal via which the shift pulse is outputted from the stage.

26. A shift register including a cascade arrangement of stages for transmitting a shift pulse,
  each of the stages comprising:
    a shift pulse input terminal via which the shift pulse is inputted;
    a first input terminal to which a first direct-current voltage is applied;
    a second input terminal to which a second direct-current voltage is applied;
    a third input terminal via which a first clock signal is inputted to each of the stages, the first clock signal having its clock pulse active in a period that is out of overlap with a period of the shift pulse that is inputted via the shift pulse input terminal,
    a fourth input terminal via which a signal indicating connection and disconnection between a first predetermined point and the second input terminal is inputted;
    a fifth input terminal via which a signal indicating connection and disconnection between a second predetermined point and the second input terminal is inputted;
    a first capacitor having one end connected to a gate terminal of a first output transistor;
    an input gate, connected to the shift pulse input terminal, which becomes conductive in accordance with a conduction control signal to allow passage of a potential during the period of the shift pulse so that the potential is supplied to the one end of the first capacitor, the conduction control signal being the shift pulse that is inputted via the shift pulse input terminal;
    a first switching element having one end connected to the other end of the first capacitor, the other end connected to the first input terminal, and a conduction and disconnection control terminal connected to the third input terminal;
    a second switching element having one end connected to the other end of the first capacitor, the other end connected to the second input terminal, and a conduction and disconnection control terminal connected to the shift pulse input terminal;
    a third switching element having one end connected to the one end of the first capacitor, the other end connected to the second input terminal, and a conduction and disconnection control terminal connected to the fourth input terminal, the one end of the first capacitor serving as the first predetermined point;
    a fourth switching element having one end connected to a first output terminal, the other end connected to the second input terminal, and a conduction and disconnection control terminal connected to the fifth input terminal, the first output terminal serving as the second predetermined point; and a first circuit, connected between the first output terminal and the second input terminal, which forms a current path between the first output terminal and the second input terminal, wherein:

either:

each of the stages further comprise a shift pulse output terminal via which the shift pulse is outputted from the stage, and the first output transistor having one drain/source terminal connected to the first input terminal, with the other drain/source terminal serving as the first output terminal via which a signal is outputted from the stage; or each of the stages further comprise the first output transistor having one drain/source terminal connected to the first input terminal, with the other drain/source terminal serving as the first output terminal via which the shift pulse is outputted from the stage;

the first circuit includes a first transistor, a ninth transistor, a tenth transistor, and an eleventh transistor;

the first transistor is a field-effect transistor, the first transistor having one drain/source terminal connected to the first output terminal and the other drain/source terminal connected to the second input terminal;

the ninth transistor is a field-effect transistor, the ninth transistor having one drain/source terminal connected to a gate terminal of the first transistor, the other drain/source terminal to which a first voltage is applied, and a gate terminal to which a bias voltage is applied;

the tenth transistor is a field-effect transistor, the tenth transistor having a gate terminal connected to one drain/source terminal of the tenth transistor and the one drain/source terminal connected to the gate terminal of the first transistor; and the eleventh transistor is a field-effect transistor, the eleventh transistor having one drain/source terminal connected to the other drain/source terminal of the tenth transistor and the other drain/source terminal to which a second voltage is applied.

27. The shift register as set forth in claim 26, wherein the ninth transistor has its gate terminal connected to the one drain/source terminal of the ninth transistor.

28. The shift register as set forth in claim 26, wherein to the gate terminal of the ninth transistor, that one of the first and second direct-current voltages which makes the ninth transistor larger in conductance than the other one does is applied.

29. The shift register as set forth in claim 26, wherein to the gate terminal of the ninth transistor, that one of the first and second direct-current voltages which makes the ninth transistor smaller in conductance than the other one does is applied.

30. The shift register as set forth in claim 26, wherein to the gate terminal of the ninth transistor, a voltage is applied which has an overdrive voltage smaller than in a case where that one of the first and second direct-current voltages which makes the ninth transistor larger in conductance than the other one does is applied to the gate terminal of the ninth transistor.

31. The shift register as set forth in claim 26, wherein the ninth transistor has its gate terminal connected to the gate terminal of the first transistor.

32. The shift register as set forth in claim 26, wherein each of the stages further comprise the shift pulse output terminal via which the shift pulse is outputted from the stage, and the first output transistor having one drain/source terminal connected to the first input terminal, with the other drain/source terminal serving as the first output terminal via which the signal is outputted from the stage.

33. The shift register as set forth in claim 26, wherein each of the stages further comprise the first output transistor having one drain/source terminal connected to the first input terminal, with the other drain/source terminal serving as the first output terminal via which the shift pulse is outputted from the stage.

* * * * *